(12) United States Patent
Du et al.

(10) Patent No.: US 12,283,321 B2
(45) Date of Patent: Apr. 22, 2025

(54) MEMORY DEVICE AND OPERATING METHOD THEREOF

(71) Applicant: Yangtze Memory Technologies Co., Ltd., Hubei (CN)

(72) Inventors: ZhiChao Du, Hubei (CN); Yu Wang, Hubei (CN); Weijun Wan, Hubei (CN); Ke Jiang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 39 days.

(21) Appl. No.: 18/090,303

(22) Filed: Dec. 28, 2022

(65) Prior Publication Data

US 2024/0203492 A1    Jun. 20, 2024

(30) Foreign Application Priority Data

Dec. 20, 2022 (CN) .......................... 202211642371.0

(51) Int. Cl.
  *G11C 16/04* (2006.01)
  *G11C 16/10* (2006.01)
  *G11C 16/34* (2006.01)

(52) U.S. Cl.
  CPC ........ *G11C 16/0433* (2013.01); *G11C 16/102* (2013.01); *G11C 16/3459* (2013.01)

(58) Field of Classification Search
  CPC .................................................. G11C 16/0433
  USPC ..................................................... 365/185.05
  See application file for complete search history.

(56) References Cited

U.S. PATENT DOCUMENTS 10,978,158 B1 *  4/2021  Du ........................... G11C 7/12
2021/0264981 A1   8/2021  Liu et al.
2022/0130474 A1   4/2022  Choi et al.

OTHER PUBLICATIONS

Zambelli et al., "Assessing the Role of Program Suspend Operation in 3D NAND Flash Based Solid State Drives," Electronics, vol. 10, No. 12, 1394, Jun. 10, 2021, 18 pages.
Oliver Hambrey, "NAND Flash Basics & Error Characteristics," Flash Memory Summit 2019, Santa Clara, CA, Aug. 5, 2019, 34 pages.

* cited by examiner

*Primary Examiner* — Anthan Tran
(74) *Attorney, Agent, or Firm* — Conley Rose, P.C.

(57) ABSTRACT

A method of programming a memory device. The memory device includes a plurality of memory strings, each memory string including a top transistor controlled by a top select gate (TSG) and connected to a bit line (BL), a bottom transistor controlled by a bottom select gate (BSG), and memory cells between the top and bottom transistors, each memory cell connected to a word line (WL). The method includes applying program pulses to a memory cell of the memory device in a program phase, verifying a voltage value of the memory cell in a verify phase, receiving a suspend command and performing a suspend operation, applying a discharge pulse to the memory cell in a discharge phase to thereby discharge the memory cell, wherein the discharge pulse includes a voltage pulse to an unselected top select gate ($TSG_{unsel}$), and suspending programming or verifying of the memory cell in a suspend phase.

18 Claims, 12 Drawing Sheets

MEMORY DEVICE AND OPERATING METHOD THEREOF

BACKGROUND

Field

The present disclosure relates to memory devices, systems, and operation methods thereof.

Background

Flash memory (flash) is a non-volatile memory that uses charge stored on a charge storage layer to represent information. Flash stores each bit (e.g., 0 or 1) in a memory cell that includes a transistor with a charge storage layer. Memory device architectures can provide ultra-high density storage. Further, a suspend program can influence results of unselected channels, since the different word lines (WL) are connected together and affect other unselected string suspend read results. In addition, when suspending during a verify phase, increased charge accumulation on the memory channel can increase a fail bit count (FBC) of the memory device.

SUMMARY

Aspects of the disclosed technology relate to operation methods to efficiently program and verify in memory devices.

In some aspects, a method of programming a memory device can include applying a plurality of program pulses to a memory cell of the memory device in a program phase. In some aspects, the memory device can include a plurality of memory strings, each memory string including a top transistor controlled by a top select gate (TSG) and connected to a bit line (BL), a bottom transistor controlled by a bottom select gate (BSG), and a plurality of memory cells between the top transistor and the bottom transistor, each memory cell connected to a word line (WL). In some aspects, the method can further include verifying a voltage value of the memory cell in a verify phase. In some aspects, the method can further include receiving a suspend command. In some aspects, the method can further include performing a suspend operation in response to the suspend command. In some aspects, the method can further include applying a discharge pulse to the memory cell in a discharge phase to thereby discharge the memory cell, wherein the discharge pulse comprises a first voltage pulse to an unselected top select gate ($TSG_{unsel}$). In some aspects, the method can further include suspending programming or verifying of the memory cell in a suspend phase.

In some aspects, the suspend command is received during the program phase. In some aspects, the discharge pulse can be applied between an end of a program phase loop of the program phase and a start of the suspend phase. In some aspects, applying the discharge pulse can include applying a merged discharge pulse. In some aspects, the merged discharge pulse can overlap the end of the program phase loop and a start of the discharge phase.

In some aspects, applying the discharge pulse can include applying a second voltage pulse to a selected top select gate ($TSG_{sel}$), a third voltage pulse to a bottom select gate (BSG), a fourth voltage pulse to an unselected word line ($WL_{unsel}$), and a fifth voltage pulse to a selected word line ($WL_{sel}$). In some aspects, the first voltage pulse can be weighted to a first turn-on voltage $V_{ON1}$ of the unselected top select gate ($TSG_{unsel}$). In some aspects, the second voltage pulse can be weighted to a second turn-on voltage $V_{tsg}$ of the selected top select gate ($TSG_{sel}$). In some aspects, the third voltage pulse can be weighted to a third turn-on voltage $V_{ON2}$ of the bottom select gate (BSG). In some aspects, the fourth voltage pulse can be weighted to a first pass voltage $V_{PASS1}$ of the unselected word line ($WL_{unsel}$). In some aspects, the fifth voltage pulse can be weighted to a second pass voltage $V_{PASS2}$ of the selected word line ($WL_{unsel}$).

In some aspects, the first turn-on voltage $V_{ON1}$ can be about 0.5 V to about 5 V. In some aspects, the second turn-on voltage $V_{tsg}$ can be about 0.5 V to about 5 V. In some aspects, the third turn-on voltage $V_{ON2}$ can be about 0.5 V to about 5 V. In some aspects, the first pass voltage $V_{PASS1}$ can be about 0.5 V to about 5 V. In some aspects, the second pass voltage $V_{PASS2}$ can be about 0.5 V to about 5 V.

In some aspects, the suspend command is received during the verify phase. In some aspects, performing the suspend operation can include immediately stopping the verify phase at a first verify state thereby decreasing a time interval of the suspend phase. In some aspects, the method can further include resuming the verify phase at a second verify state after the first verify state. In some aspects, the method can further include storing the first verify state before the discharge phase. In some aspects, the method can further include reinitiating the entire verify phase.

In some aspects, performing the suspend operation can include completing the entire verify phase before the discharge phase. In some aspects, applying the discharge pulse can include applying a merged discharge pulse. In some aspects, the merged discharge pulse can overlap an end of a verify phase loop of the verify phase and a start of the discharge phase.

In some aspects, the suspend command is received at the end of the verify phase loop, at a start of a sixth voltage pulse to a programmed bit line ($BL_{pgm}$), and during the first voltage pulse of unselected top select gate ($TSG_{unsel}$). In some aspects, the suspend command is received during the verify phase loop, before a start of a second voltage pulse to a programmed bit line ($BL_{pgm}$), and during the first voltage pulse of the unselected top select gate ($TSG_{unsel}$).

In some aspects, a time duration of the discharge pulse is based on a tuning parameter configured to optimize the time duration and thereby decrease a fail bit count (FBC) of the memory device. In some aspects, the tuning parameter comprises a period, an amplitude, a shape, a heuristically determined value, an experimentally determined value, and/or a combination thereof.

In some aspects, a memory device can include a memory array and a peripheral circuit coupled to the memory array. In some aspects, the memory array can include a plurality of memory strings. In some aspects, each memory string can include a top transistor controlled by a top select gate (TSG) and connected to a bit line (BL), a bottom transistor controlled by a bottom select gate (BSG), and a plurality of memory cells between the top transistor and the bottom transistor, each memory cell connected to a word line (WL). In some aspects, the peripheral circuit can be configured to apply a plurality of program pulses to a memory cell of the memory array in a program phase. In some aspects, the peripheral circuit can be further configured to verify a voltage value of the memory cell in a verify phase. In some aspects, the peripheral circuit can be further configured to receive a suspend command. In some aspects, the peripheral circuit can be further configured to perform a suspend operation in response to the suspend command. In some aspects, the peripheral circuit can be further configured to apply a discharge pulse to the memory cell in a discharge phase to thereby discharge the memory cell, wherein the discharge pulse comprises a first voltage pulse to an unselected top select gate ($TSG_{unsel}$). In some aspects, the peripheral circuit can be further configured to suspend programming or verifying of the memory cell in a suspend phase.

In some aspects, the peripheral circuit receives the suspend command during the program phase. In some aspects, the peripheral circuit can be further configured to apply a merged discharge pulse, wherein the merged discharge pulse overlaps an end of a program phase loop of the program phase and a start of the discharge phase. In some aspects, the peripheral circuit receives the suspend command during the program phase and the peripheral circuit is further configured to apply a merged discharge pulse, the merged discharge pulse overlapping an end of a program phase loop of the program phase and a start of the discharge phase.

In some aspects, the peripheral circuit receives the suspend command during the verify phase. In some aspects, the peripheral circuit can be further configured to immediately stop the verify phase at a first verify state after receiving the suspend command thereby decreasing a time interval of the suspend phase. In some aspects, the suspend operation can include immediately stopping the verify phase at a first verify state after receiving the suspend command thereby decreasing a time interval of the suspend phase. In some aspects, the peripheral circuit can be further configured to complete the entire verify phase before the discharge phase after receiving the suspend command. In some aspects, the suspend operation can include completing the entire verify phase before the discharge phase after receiving the suspend command.

In some aspects, a memory system can include a memory device and a memory controller coupled to the memory device. In some aspects, the memory device can include a plurality of memory strings. In some aspects, each memory string can include a top transistor controlled by a top select gate (TSG) and connected to a bit line (BL), a bottom transistor controlled by a bottom select gate (BSG), and a plurality of memory cells between the top transistor and the bottom transistor, each memory cell connected to a word line (WL). In some aspects, the memory controller can be configured to apply a plurality of program pulses to a memory cell of the memory device in a program phase. In some aspects, the memory controller can be further configured to verify a voltage value of the memory cell in a verify phase. In some aspects, the memory controller can be further configured to receive a suspend command. In some aspects, the memory controller can be further configured to perform a suspend operation in response to the suspend command. In some aspects, the memory controller can be further configured to apply a discharge pulse to the memory cell in a discharge phase to thereby discharge the memory cell, wherein the discharge pulse comprises a first voltage pulse to an unselected top select gate ($TSG_{unsel}$). In some aspects, the memory controller can be further configured to suspend programming or verifying of the memory cell in a suspend phase.

In some aspects, the memory controller can receive the suspend command during the program phase. In some aspects, the memory controller can be further configured to apply a merged discharge pulse. In some aspects, the merged discharge pulse can overlap an end of a program phase loop of the program phase and a start of the discharge phase. In some aspects, the memory controller can receive the suspend command from a host. In some aspects, the memory controller can receive the suspend command from itself.

Implementations of any of the techniques described above may include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

Figure 1:
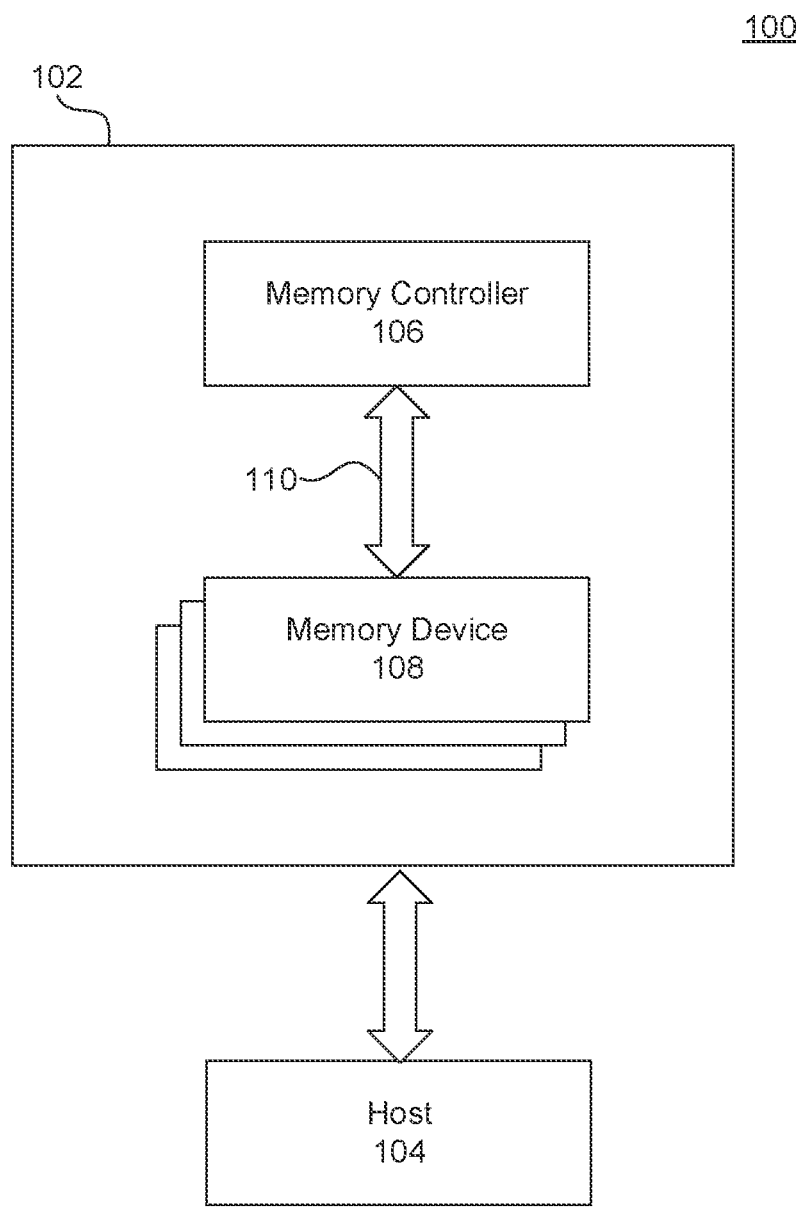
FIG. 1 is a schematic illustration of a memory system with a memory controller and a memory device, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; NAND flash devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such aspects in more detail, however, it is instructive to present example environments in which aspects of the present disclosure may be implemented.

Exemplary Memory System

Figure 2:
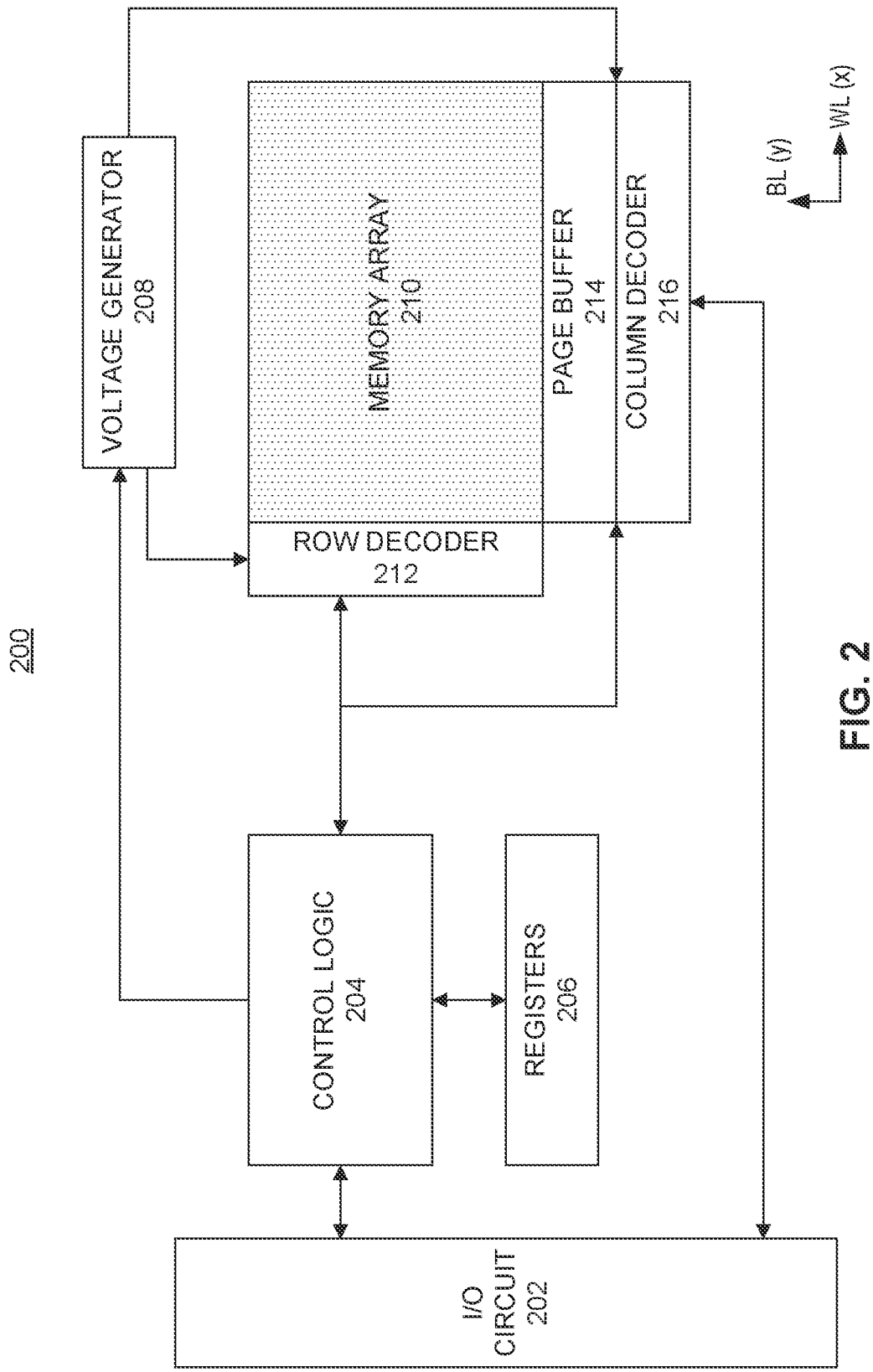
FIG. 2 is a schematic block diagram of a memory device shown in FIG. 1, according to an exemplary aspect.
Figure 3:
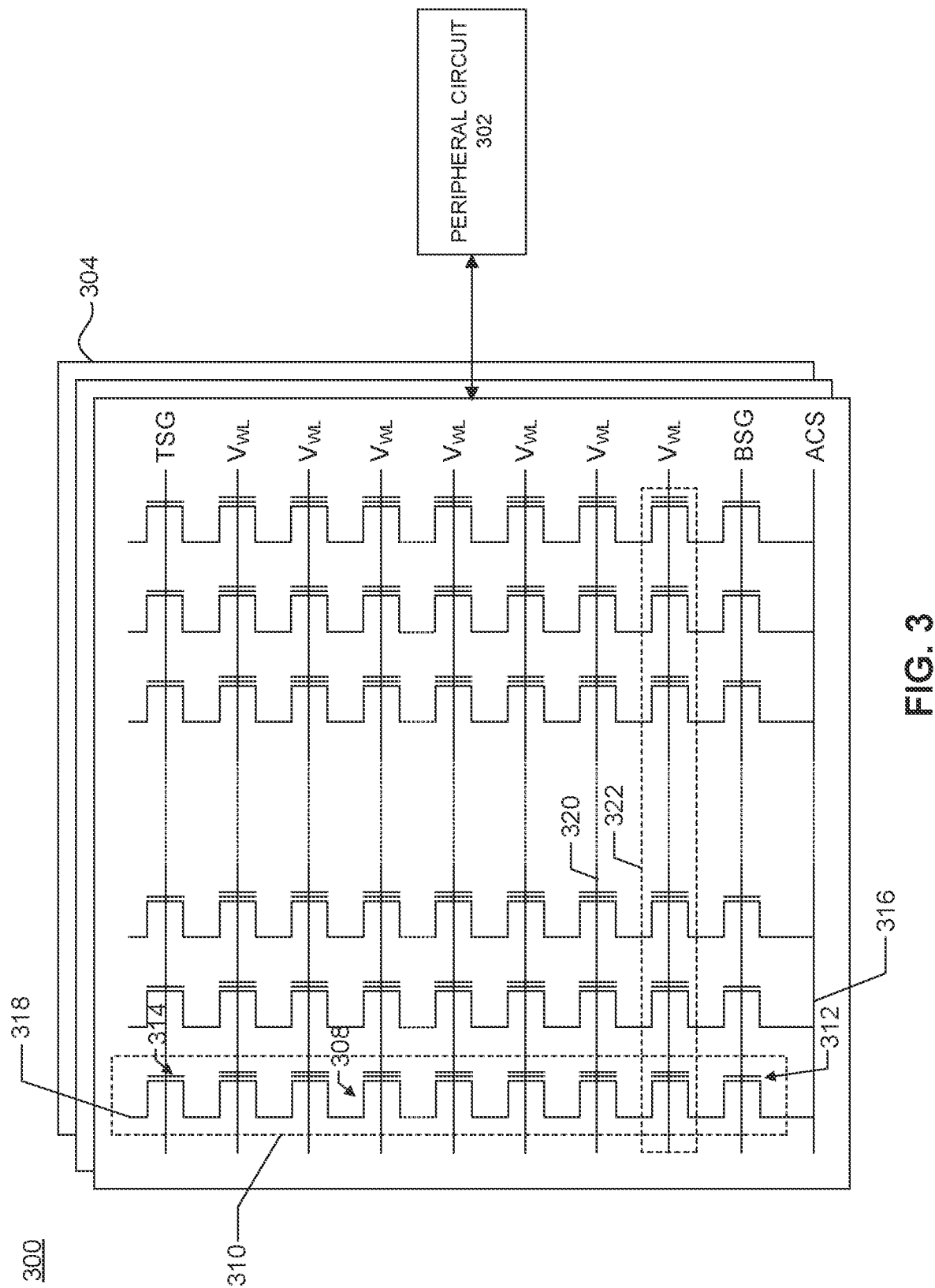
FIG. 3 is a schematic circuit diagram of a memory array of the memory device shown in FIG. 2, according to an exemplary aspect.

FIGS. 1-3 illustrate memory system 100 with memory controller 106 and memory device 108, according to various exemplary aspects. Memory system 100 can be configured to increase program suspending and resuming efficiency and decrease program suspend times. Memory system 100 can be further configured to increase verify suspending and resuming efficiency and decrease verify suspend times. memory system 100 can be further configured to decrease a fail bit count (FBC). Memory system 100 can be further configured to program, verify, and/or read a page (or other unit) of memory device 108.

Although memory system 100 is shown in FIGS. 1-3 as a stand-alone apparatus and/or system, the aspects of this disclosure can be used with other apparatuses, systems, and/or methods, such as, but not limited to, memory apparatus 102, memory controller 106, memory device 108, program and verify process 400, program and verify process 500, program and verify process 600, program and verify process 700, operation method 800, operation method 900, operation method 1000, operation method 1100, flow diagram 1200, and/or flow diagram 1300.

As shown in FIG. 1, memory system 100 can include, but is not limited to, wireless communication devices, smartphones, laptops, desktops, tablets, personal assistant devices, monitors, televisions, wearable devices, Internet of Things (IoT) devices, vehicle communication devices, and the like. Memory system 100 can include a memory apparatus 102 and a host 104. In some aspects, memory apparatus 102 can also be referred to as a solid state drive (SSD), which can include one or more memory devices 108 and memory controller 106. The one or more memory devices 108 can communicate with the host 104 through the memory controller 106, where the memory controller 106 can be connected to the memory device 108 via a memory channel 110. In some aspects, the memory apparatus 102 can have more than one memory device 108, while each memory device 108 can be managed by the memory controller 106. In some aspects, the memory controller 106 can include one or more processors.

Host 104 sends data to be stored at the memory apparatus 102 or retrieves data by reading the memory apparatus 102. Memory controller 106 can handle I/O requests received from the host 104, ensure data integrity and efficient storage, and manage the memory device 108. The memory channel 110 can provide data and control communications between the memory controller 106 and the one or more memory devices 108 via a data bus.

The memory device 108 (e.g., "flash," "NAND flash," "NAND") can be a memory chip (package), a memory die, or any portion of a memory die, and can include one or more memory planes, each of which can include a plurality of memory blocks. Identical and concurrent operations can take place at each memory plane. The memory block, which can be megabytes (MB) in size, is the smallest size to carry out erase operations. In some aspects, the memory device 108 can include four memory planes and each memory plane can include six memory blocks. Each memory block can include a plurality of memory cells, where each memory cell can be addressed through interconnections such as bit lines (BL) and word lines (WL). The bit lines (BL) and word lines (WL) can be laid out perpendicularly (e.g., in rows and columns, respectively), forming an array of metal lines. In this disclosure, the memory block is also referred to as the "memory array" or "array." The memory array is the core area in a memory device, performing storage functions.

FIG. 2 illustrates a schematic block diagram of memory device 200, according to an exemplary aspect. In some aspects, memory device 200 can be an example of memory device 108 shown in FIG. 1. As shown in FIG. 2, memory device 200 can include digital, analog, and/or mixed-signal circuits to support functions of a memory array 210, for example, row decoders 212, page buffers 214, and column decoders 216. Memory device 200 can also include I/O circuit 202, a control logic 204, a register 206, and a voltage generator 208. Control logic 204 can be configured to control other components of the memory device 200. For example, control logic 204 can control voltage generator 208, which generates voltages to be applied to memory cells of memory array 210. Registers 206 can be coupled to control logic 204 and include registration information, such as address information. In some aspects, memory device 200 can communicate with a controller, such as memory controller 106 shown in FIG. 1 via the I/O circuit 202. For example, memory device 200 can receive commands from the controller via the I/O circuit 202 and/or transmit data retrieved from the memory array 210 to the controller.

It is noted that the layout of the electronic components in memory apparatus 102 of FIG. 1 and memory device 200 of FIG. 2 are shown as an example. The memory apparatus 102 and the memory device 200 can have other layouts and can include additional components.

FIG. 3 illustrates a schematic circuit diagram 300 of a memory device, according to an exemplary aspect. The example schematic circuit diagram 300 includes a memory cell array 304 and a peripheral circuit 302. In some aspects, the example schematic circuit diagram 300 can include a plurality of memory strings 310, each memory string 310 having a plurality of memory cells 308. The memory string 310 also includes at least one transistor (e.g., a MOSFET) at each end, which is controlled by a bottom select gate (BSG) 312 and a top select gate (TSG) 314, respectively. The memory cell 308 can be controlled by a control gate, where the control gate can be connected to a word line (WL) 320 of the example schematic circuit diagram 300. The drain terminal of the TSG 314 can be connected to the bit line (BL) 318, and the source terminal of the BSG 312 can be connected to an array common source (ACS) 316. The ACS 316 can be shared by the memory strings 310 in an entire memory block, and is also referred to as the common source line.

In some aspects, the example schematic circuit diagram 300 can be formed based on charge trapping technology. In some aspects, the example schematic circuit diagram 300 can be formed based on the floating gate technology. NAND flash memory based on charge trapping can provide high storage density and high intrinsic reliability. Storage data or logic states (e.g., threshold voltage Vth of the memory cell 308) depends on the amount of charge trapped in a storage layer. In some aspects, the memory array 210 can be a three-dimensional (3D) memory device, and the example schematic circuit diagram 300 can be a 3D memory array, where the memory cells 308 can be vertically stacked on top of each other.

In a NAND flash memory, read and write operations can be performed in a memory page 322, which includes all memory cells 308 sharing the same word line (WL). In a NAND memory, the memory cell 308 can be in an erase state (ER) or a programmed state (PN). Initially, all memory cells 308 in the example schematic circuit diagram 300 can be reset to the erase state as logic "1" by implementing a negative voltage difference between control gates and source terminals of the memory cells (e.g., the array common source 316) such that all the trapped electronic charges in the storage layer of the memory cells 308 can be removed. For example, the negative voltage difference can be induced by setting the control gates of the memory cells 308 to ground, and applying a high positive voltage to the array common source 316. At the erase state (ER), the threshold voltage Vth of the memory cells 308 can be reset to the lowest value, and can be measured or sensed at the bit line (BL) 318.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 308, and thereby increase the threshold voltage Vth of the memory cell 308. Thus, the memory cell 308 is programmed to the programmed state (e.g., P1).

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER and P1-P7. In the QLC mode, a memory cell stores 4 bits and has sixteen states, i.e., states ER and P1-P15.

Memory controller 106 can be configured to control memory device 108 (e.g., program memory device 108). Memory controller 106 can be further configured to increase program suspending and resuming efficiency and decrease program suspend times. Memory controller 106 can be further configured to increase verify suspending and resuming efficiency and decrease verify suspend times. Memory controller 106 can be further configured to decrease a FBC.

In some aspects, memory controller 106 can store a program code or other information. For example, memory controller 106 can store a program code (e.g., voltage distribution, voltage value, program value, verify value, etc.). In some aspects, memory controller 106 can implement an operation method. For example, memory controller 106 can implement an operation method (e.g., operation method 800, operation method 900, operation method 1000, operation method 1100, etc.). In some aspects, memory controller 106 can receive a suspend command, for example, from a host. For example, memory controller 106 can receive a suspend command from host 104.

Exemplary Program and Verify Processes

Figure 4:
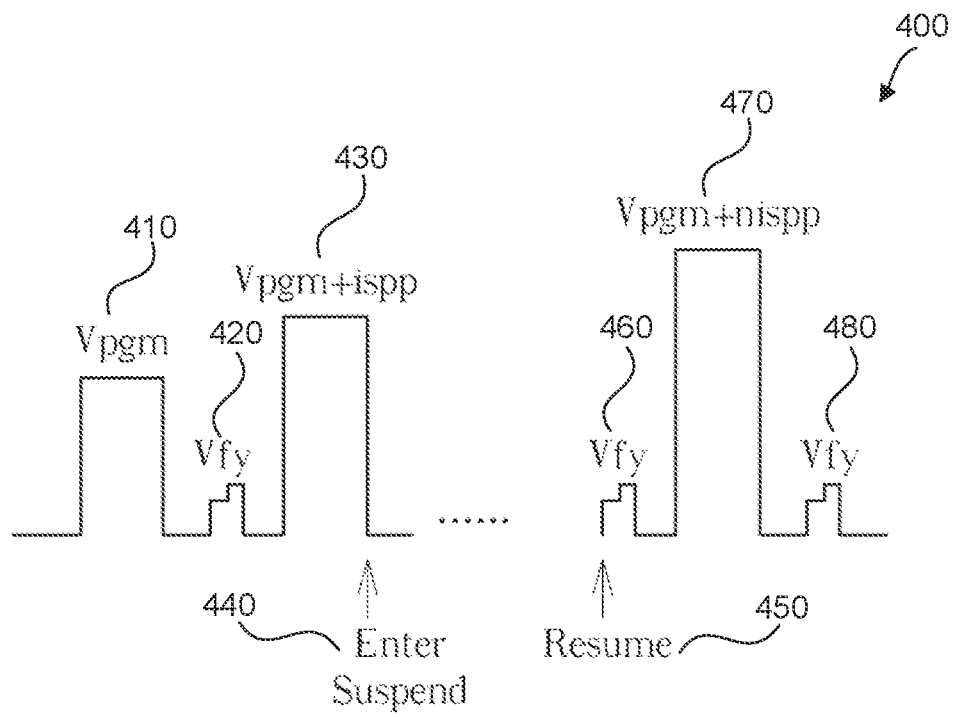
FIG. 4 is a schematic illustration of a program and verify process with a suspend phase, according to an exemplary aspect.
Figure 5:
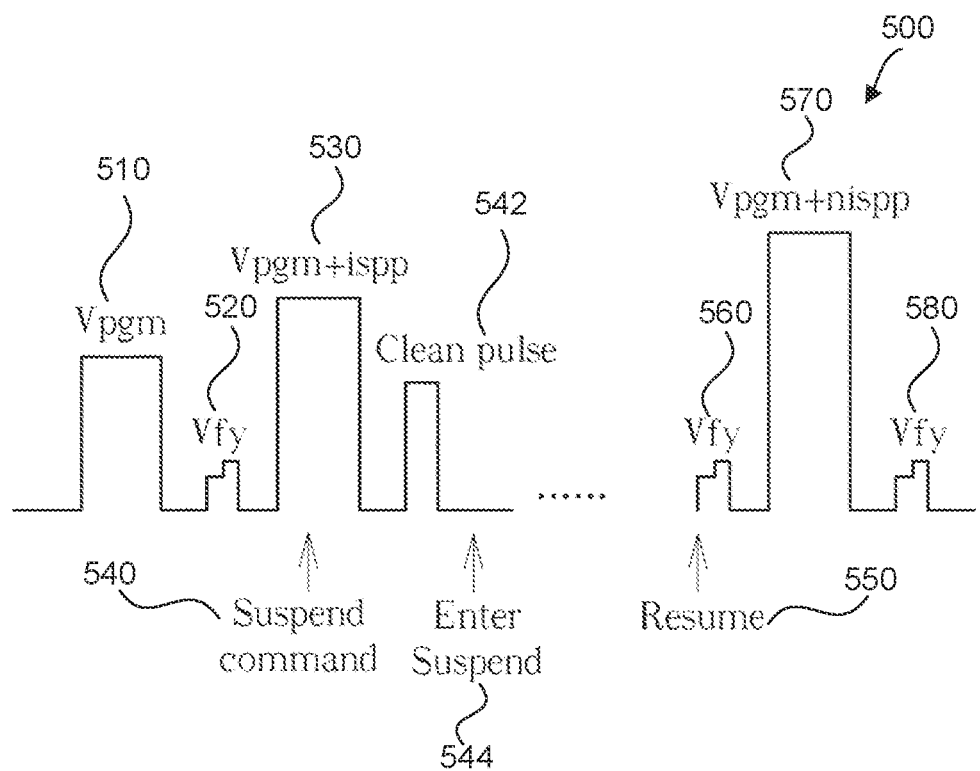
FIG. 5 is a schematic illustration of a program and verify process with a clean pulse, according to an exemplary aspect.
Figure 6:
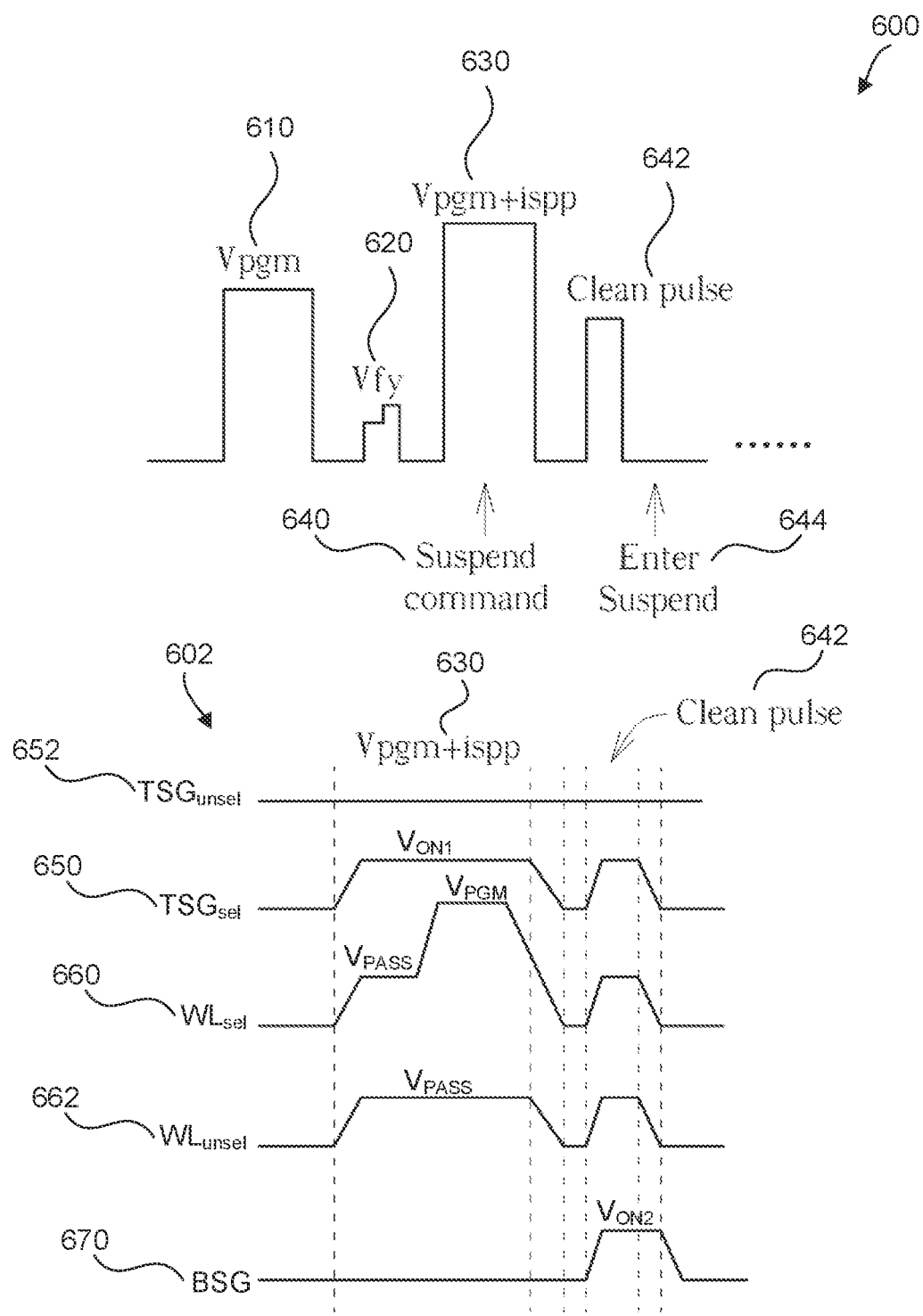
FIG. 6 is a schematic illustration of a timing diagram of a program and verify process, according to an exemplary aspect.
Figure 7:
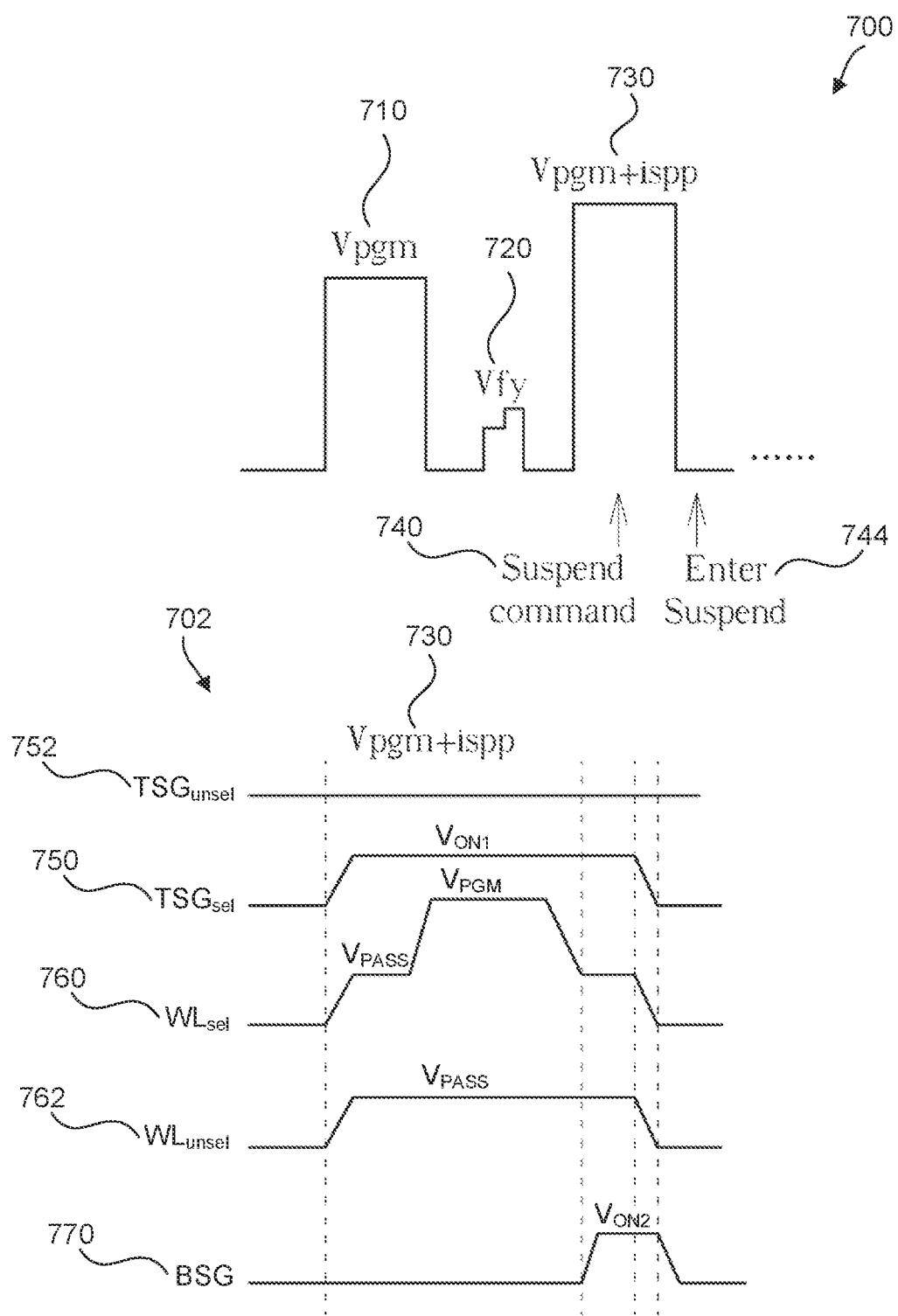
FIG. 7 is a schematic illustration of a timing diagram of a program and verify process, according to an exemplary aspect.

FIGS. 4-7 illustrate program and verify processes 400, 500, 600, 700 and timing diagrams 602, 702, according to various exemplary aspects. FIG. 4 is a schematic illustration of program and verify process 400 with suspend phase 440, according to an exemplary aspect. FIG. 5 is a schematic illustration of program and verify process 500 with clean pulse 542, according to an exemplary aspect. FIG. 6 is a schematic illustration of timing diagram 602 of program and verify process 600, according to an exemplary aspect. FIG. 7 is a schematic illustration of timing diagram 702 of program and verify process 700, according to an exemplary aspect.

Program and verify processes 400, 500, 600, 700 and timing diagrams 602, 702 can be configured to control one or more operations (e.g., program, verify, suspend, read, resume, etc.) of memory system 100.

Although program and verify processes 400, 500, 600, 700 and timing diagrams 602, 702 are shown in FIGS. 4-7 as a stand-alone apparatus, system, and/or method, the aspects of this disclosure can be used with other apparatuses, systems, and/or methods, such as, but not limited to, memory system 100, memory controller 106, memory device 108, operation method 800, operation method 900, operation method 1000, operation method 1100, flow diagram 1200, and/or flow diagram 1300. Program and verify processes 400, 500, 600, 700 and timing diagrams 602, 702 are described in further detail in U.S. Pat. No. 10,978,158, which is incorporated by reference herein in its entireties.

Some aspects of this disclosure provide programming by using an incremental step pulse programming (ISPP) in which the programming voltage can be incrementally increased by adding a step pulse. In some aspects, the step is also referred to as a step voltage. For example, the memory device verifies the memory cell after a programming voltage is applied to the memory cell. If a threshold voltage of the memory cell does not reach a target programming state, e.g., the threshold voltage is not within a required voltage range, the memory device increases the programming voltage by the step pulse and applies the increased programming voltage to the memory cell. If the threshold voltage of the memory cell reaches the target programming state, e.g., the threshold is within the required voltage range, the memory device inhibits the memory cell.

A program and verify process can utilize ISPP and be configured to program and verify voltage values (e.g., memory controller 106 of memory system 100 shown in FIG. 1). A program operation can include several program pulse steps, where a gate voltage of each program pulse is increased by a constant value after each program pulse step. A verify operation can include several verify pulse steps applied between each respective program pulse to verify a threshold voltage (Vth) of each memory cell. Memory cells that pass the verify operation can be inhibited (e.g., a voltage Vinh is applied across bit line such that charge remains in the charge storage layer of selected word line) in the subsequent program step. Memory cells that fail the verify operation can be programmed in the subsequent program step. ISPP can be used for the above described program and verify operations.

As shown in FIG. 4, program and verify process 400 can include first program step ($V_{pgm}$) 410, first verify step ($V_{fv}$) 420, second program step ($V_{pgm+ISPP}$) 430, suspend phase 440, resume phase 450, second verify step ($V_{fv}$) 460, n$^{th}$ program step ($V_{pgm+nISPP}$) 470, and/or n$^{th}$ verify step ($V_{fv}$) 480. As can be seen, program and verify process 400 can include a plurality of programming voltage pulses (e.g., first program step ($V_{pgm}$) 410, second program step ($V_{pgm+ISSP}$) 430, etc.) in a plurality of programming phases, where the voltages of the plurality of programming voltage pulses are increased incrementally by the value ISPP (e.g., incremental step pulse programming). A verify phase (e.g., first verify step ($V_{fv}$) 420, second verify step ($V_{fv}$) 460, etc.) can also be included to verify if the program phases are successful.

During the program phase (e.g., first program step ($V_{pgm}$) 410, second program step ($V_{pgm+ISPP}$) 430, etc.), incremental voltage pulses can be applied to increase a voltage level of each voltage pulse (e.g., ISPP) to store a bit (e.g., 0 or 1) in a memory cell of the memory array until passing the verify phase. If the verification fails, another programming voltage pulse with a higher voltage level can be applied to program the memory cell of the memory array.

Suspend phase 440 can be performed to suspend a program operation (e.g., write, read, etc.) on a given page of memory cells in order to read data from a separate page of memory cells (e.g., suspend read operation). In some aspects, a programming voltage pulse count (e.g., second program step ($V_{pgm+ISSP}$) 430) corresponding to the current program operation can be stored (e.g., in cache) before suspending the program operation. For example, a voltage level of the programming voltage pulse can be based on the programming voltage pulse count stored before suspend phase 440. In some aspects, suspend phase 440 can be configured to make memory controller 106 idle (e.g., stop program phase) and follow a separate command (e.g., suspend operation, read command) before entering resume phase 450.

The aspects of program and verify process 400 shown in FIG. 4 and the aspects of program and verify process 500 shown in FIG. 5 may be similar. Similar reference numbers are used to indicate features of the aspects of program and verify process 400 shown in FIG. 4 and the similar features of the aspects of program and verify process 500 shown in FIG. 5. In some aspects, as shown in FIG. 5, program and verify process 500 can include suspend command 540 received during the program phase (e.g., second program step ($V_{pgm+ISPP}$) 530) and clean pulse 542 applied after the program phase but prior to entering suspend phase 544, rather than transitioning from the program phase (e.g., second program step ($V_{pgm+ISPP}$) 430) directly to the suspend phase 440 of program and verify process 400 shown in FIG. 4.

As shown in FIG. 5, program and verify process 500 can include first program step ($V_{pgm}$) 510, first verify step ($V_{fv}$) 520, second program step ($V_{pgm+ISPP}$) 530, suspend command 540, clean pulse 542, suspend phase 544, resume phase 550, second verify step ($V_{fv}$) 560, n$^{th}$ program step ($V_{pgm+nISPP}$) 570, and/or n$^{th}$ verify step ($V_{fv}$) 580. During the program phase (e.g., first program step ($V_{pgm}$) 510, second program step ($V_{pgm+ISPP}$) 530, etc.), incremental voltage pulses are applied to increase a voltage level of each voltage pulse (e.g., ISPP) to store a bit (e.g., 0 or 1) in a memory cell of a selected memory string until passing the verify phase. During the verify phase (e.g., first verify step ($V_{fv}$) 520, second verify step ($V_{fv}$) 560, etc.), the voltage level of each voltage pulse is compared (verified) to confirm whether the program phase was successful.

Suspend command 540 can be received during program phase (e.g., second program step ($V_{pgm+ISPP}$) 530). Suspend command 540 can initiate a suspend operation, for example, during the program phase (e.g., during second program step ($V_{pgm+ISPP}$) 530). In some aspects, the suspend operation can include storing (e.g., in cache) a programming voltage pulse count (e.g., second program step ($V_{pgm+ISSP}$) 530). In some aspects, the suspend operation can include completing the current program phase (e.g., second program step ($V_{pgm+ISPP}$) 530). In some aspects, the suspend operation can include applying clean pulse 542 to a selected memory string.

Clean pulse 542 can be configured to discharge one or more memory cells (e.g., memory cells 308) after suspend command 540 is received but prior to suspend phase 544, thereby decreasing a FBC of the memory device 108. Clean pulse 542 can be applied to discharge memory cells of a corresponding (selected) memory string (e.g., memory cells 308 of memory string 318 shown in FIG. 3). In some aspects, clean pulse 542 can be applied after a suspend operation (e.g., in response to suspend command 540) is completed.

In some aspects, a voltage level and/or pulse width of clean pulse 542 can be adjustable, for example, according to different utilization scenarios. For example, the voltage level and pulse width of clean pulse 542 can be a fixed value. In some aspects, the fixed value can be pre-determined or determined by calibration, a mapping table, and/or dynamically adjusted accordingly to the specific utilization scenario, for example, the fixed value can be determined or adjusted based on a voltage (e.g., program voltage), a current (e.g., leakage current), a temperature (e.g., of memory cell 308), age (e.g., of memory cell 308), and/or a combination thereof.

Suspend phase 544 can be performed to suspend a program operation (e.g., write, read, etc.) on a given page of memory cells in order to read data from a separate page of memory cells (e.g., suspend read operation). In some aspects, suspend phase 544 can be configured to make memory controller 106 idle (e.g., stop program phase) and follow a separate command (e.g., suspend read operation) before entering resume phase 550.

The aspects of program and verify process 500 shown in FIG. 5 and the aspects of program and verify process 600 shown in FIG. 6 may be similar. Similar reference numbers are used to indicate features of the aspects of program and verify process 500 shown in FIG. 5 and the similar features of the aspects of program and verify process 600 shown in FIG. 6.

As shown in FIG. 6, program and verify process 600 can include timing diagram 602, first program step ($V_{pgm}$) 610, first verify step ($V_{fy}$) 620, second program step ($V_{pgm+ISPP}$) 630, suspend command 640, clean pulse 642, and/or suspend phase 644. During the program phase (e.g., first program step ($V_{pgm}$) 610, second program step ($V_{pgm+ISPP}$) 630, etc.), incremental voltage pulses are applied to increase a voltage level of each voltage pulse (e.g., ISPP) to store a bit (e.g., 0 or 1) in a memory cell of a selected memory string until passing the verify phase. During the verify phase (e.g., first verify step ($V_{fy}$) 620, etc.), the voltage level of each voltage pulse is compared (verified) to confirm whether the program phase was successful.

Suspend command 640 can be received during program phase (e.g., second program step ($V_{pgm+ISPP}$) 630). Suspend command 640 can initiate a suspend operation, for example, during the program phase (e.g., during second program step ($V_{pgm+ISPP}$) 630). In some aspects, the suspend operation can include storing (e.g., in cache) a programming voltage pulse count (e.g., second program step ($V_{pgm+ISSP}$) 630). In some aspects, the suspend operation can include completing the current program phase (e.g., second program step ($V_{pgm+ISPP}$) 630). In some aspects, the suspend operation can include applying clean pulse 642 to a selected memory string.

Clean pulse 642 can be configured to discharge one or more memory cells (e.g., memory cells 308) after suspend command 640 is received but prior to suspend phase 644, thereby decreasing a FBC of the memory device 108. Clean pulse 642 can be applied to discharge memory cells of a corresponding (selected) memory string (e.g., memory cells 308 of memory string 318 shown in FIG. 3). In some aspects, clean pulse 642 can be applied after a suspend operation (e.g., in response to suspend command 640) is completed.

In some aspects, a voltage level and/or pulse width of clean pulse 642 can be adjustable, for example, according to different utilization scenarios. For example, the voltage level and pulse width of clean pulse 642 can be a fixed value. In some aspects, the fixed value can be pre-determined or determined by calibration, a mapping table, and/or dynamically adjusted accordingly to the specific utilization scenario, for example, the fixed value can be determined or adjusted based on a voltage (e.g., program voltage), a current (e.g., leakage current), a temperature (e.g., of memory cell 308), age (e.g., of memory cell 308), and/or a combination thereof.

Timing diagram 602 can include selected top select gate ($TSG_{sel}$) 650, unselected top select gate ($TSG_{unsel}$) 652, selected word line ($WL_{sel}$) 660, unselected word line ($WL_{unsel}$) 662, and/or bottom select gate (BSG) 670. Bottom select gate (BSG) 670 can be enabled in a discharge phase (e.g., clean pulse 642), which can discharge (release) charge (e.g., holes) accumulated on the memory cell and decrease programming errors (e.g., FBC) of the memory cell.

During second program step ($V_{pgm+ISPP}$) 630, a selected memory cell can be programmed by ramping selected word line ($WL_{sel}$) 660 to a pass voltage $V_{PASS}$ and then to a program voltage $V_{PGM}$, unselected word line ($WL_{unsel}$) 662 can be biased at the pass voltage $V_{PASS}$, selected top select gate ($TSG_{sel}$) 650 can be biased at turn-on voltage $V_{ON1}$, unselected top select gate ($TSG_{unsel}$) 652 can be biased at a set level (e.g., ground level GND), and bottom select gate (BSG) 670 can be biased at a set level (e.g., ground level GND).

During clean pulse 642, selected word line ($WL_{sel}$) 660 can be biased to the pass voltage $V_{PASS}$, unselected word line ($WL_{unsel}$) 662 can be biased at the pass voltage $V_{PASS}$, selected top select gate ($TSG_{sel}$) 650 can be biased at turn-on voltage $V_{ON1}$, unselected top select gate ($TSG_{unsel}$) 652 can be biased at a set level (e.g., ground level GND), and bottom select gate (BSG) 670 can be biased at turn-on voltage $V_{ON2}$.

The aspects of program and verify process 600 shown in FIG. 6 and the aspects of program and verify process 700 shown in FIG. 7 may be similar. Similar reference numbers are used to indicate features of the aspects of program and verify process 600 shown in FIG. 6 and the similar features of the aspects of program and verify process 700 shown in FIG. 7.

As shown in FIG. 7, program and verify process 700 can include timing diagram 702, first program step ($V_{pgm}$) 710, first verify step ($V_{fy}$) 720, second program step ($V_{pgm+ISPP}$) 730, suspend command 740, and/or suspend phase 744. Timing diagram 702 can include selected top select gate ($TSG_{sel}$) 750, unselected top select gate ($TSG_{unsel}$) 752, selected word line ($WL_{sel}$) 760, unselected word line ($WL_{unsel}$) 762, and/or bottom select gate (BSG) 770. Bottom select gate (BSG) 770 can be enabled in a program phase (e.g., second program step ($V_{pgm+ISPP}$) 730), which can discharge (release) charge (e.g., holes) accumulated on the memory cell and decrease programming errors (e.g., FBC) of the memory cell.

During second program step ($V_{pgm+ISPP}$) 730, a selected memory cell can be programmed by ramping selected word line ($WL_{sel}$) 760 to a pass voltage $V_{PASS}$ and then to a program voltage $V_{PGM}$, unselected word line ($WL_{unsel}$) 762 can be biased at the pass voltage $V_{PASS}$, selected top select gate ($TSG_{sel}$) 750 can be biased at turn-on voltage $V_{ON1}$, unselected top select gate ($TSG_{unsel}$) 752 can be biased at a set level (e.g., ground level GND), and bottom select gate (BSG) 770 can be biased early at turn-on voltage $V_{ON2}$ towards the end of second program step ($V_{pgm+ISPP}$) 730. In some aspects, second program step ($V_{pgm+ISPP}$) 730 can include a discharge phase (e.g., bottom select gate (BSG) 770) that shortly overlaps with second program step ($V_{pgm+ISPP}$) 730 thereby reducing transient time between second program step ($V_{pgm+ISPP}$) 730 and suspend phase 744.

Exemplary Operation Methods During Program Phase

Memory device architectures can provide ultra-high density storage. For example, a 3D NAND flash memory device can be formed from a vertically stacked array of alternating conductive and dielectric layers. In 3D NAND flash, memory cells of the memory strings can be combined into pages for programming and read operations (e.g., 128k cells per page). The pages can be combined into blocks for erase operations (e.g., 64 pages per block). Program operations (e.g., write) can occur in groups or pages of multiple memory cells. Read operations can occur in pages or smaller sets of memory cells.

However, with the increasing number of memory cells per page, a program operation of one page address may need to be suspended immediately in order to perform a read operation on a separate page address (e.g., suspend read). Further, if a program operation is suspended during a verify phase, the verify phase must be entirely completed before the read operation is started (e.g., increased read latency). In addition, current memory devices utilize longer memory strings (e.g., NAND strings).

However, when the memory string (e.g., NAND string) is longer, opening only the bottom select gate (BSG) is not enough to adequately remove (e.g., clean) charge accumulated on the memory channel. Further, a suspend program can influence results of unselected channels, since the different word lines (WL) are connected together and affect other unselected string suspend read results. In addition, when suspending during a verify phase, increased charge accumulation on the memory channel can increase a FBC of memory system 100.

Aspects of operation apparatuses, systems, and methods as discussed below can provide efficient program suspending and resuming and verify suspending and resuming in memory system 100, decrease program suspend times and decrease verify suspend times in memory system 100, and decrease a FBC of memory system 100.

Figure 8:
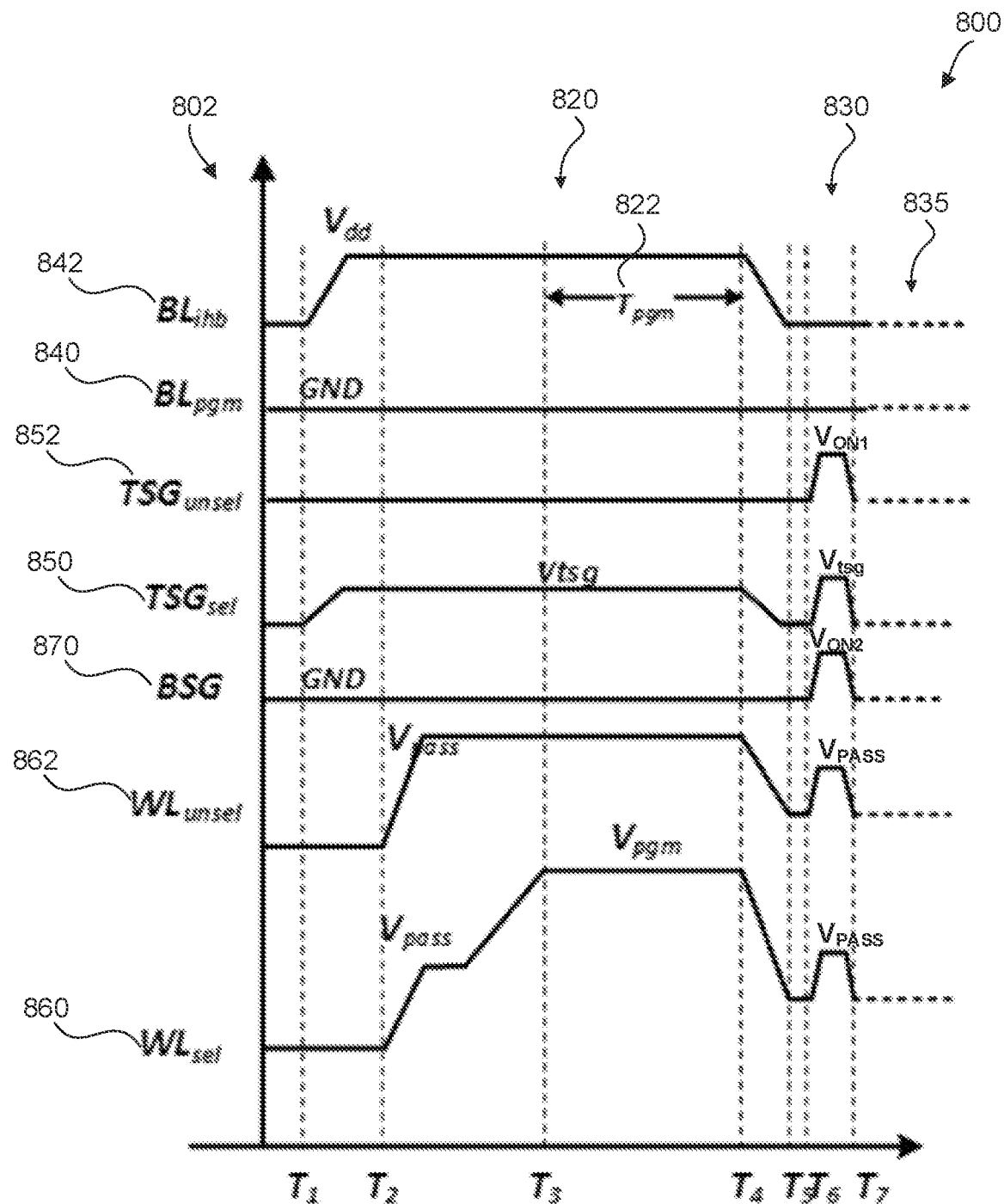
FIG. 8 is a schematic illustration of a timing diagram of an operation method of a memory device, according to an exemplary aspect.
Figure 9:
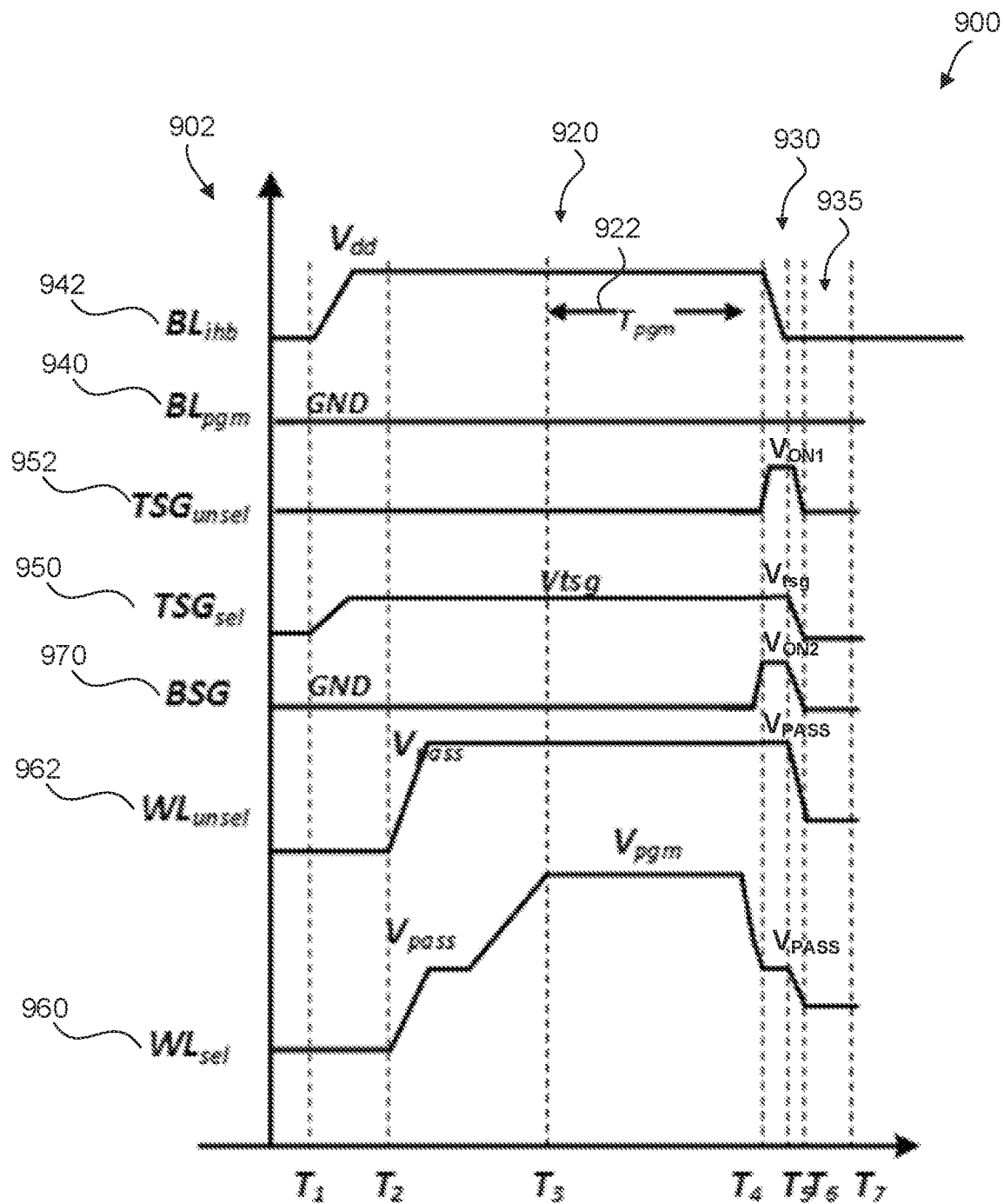
FIG. 9 is a schematic illustration of a timing diagram of an operation method of a memory device, according to an exemplary aspect.

FIGS. 8 and 9 illustrate operation methods 800, 900, according to various exemplary aspects. FIG. 8 is a schematic illustration of operation method 800 with timing diagram 802 of a program and verify process having a clean pulse 830, according to an exemplary aspect. FIG. 9 is a schematic illustration of operation method 900 with timing diagram 902 of a program and verify process having a merged clean pulse 930, according to an exemplary aspect.

Operation methods 800, 900 can be configured to increase program suspending and resuming efficiency and decrease program suspend times in memory system 100. Operation methods 800, 900 can be further configured to decrease a FBC of memory system 100.

Although operation methods 800, 900 are shown in FIGS. 8 and 9 as a stand-alone apparatus, system, and/or method, the aspects of this disclosure can be used with other apparatuses, systems, and/or methods, such as, but not limited to, memory system 100, memory controller 106, memory device 108, program and verify process 400, program and verify process 500, program and verify process 600, program and verify process 700, operation method 1000, operation method 1100, flow diagram 1200, and/or flow diagram 1300.

The aspects of program and verify process 600 shown in FIG. 6 and the aspects of operation method 800 shown in FIG. 8 may be similar. Similar reference numbers are used to indicate features of the aspects of program and verify process 600 shown in FIG. 6 and the similar features of the aspects of operation method 800 shown in FIG. 8. In some aspects, as shown in FIG. 8, operation method 800 can include first voltage pulse of unselected top select gate ($TSG_{unsel}$) 852 during clean pulse 830, rather than inactive (e.g., grounded, 0 V) unselected top select gate ($TSG_{unsel}$) 652 during clean pulse 642 of program and verify process 600 shown in FIG. 6.

As shown in FIG. 8, operation method 800 can include timing diagram 802, program phase 820, program period 822, clean pulse 830, and suspend phase 835. Operation method 800 can receive a suspend command (e.g., similar to suspend command 640 shown in FIG. 6) during program phase 820. Clean pulse 830 can be applied after receiving the suspend command but prior to any subsequent memory operation (e.g., suspend read) to discharge memory cell and decrease programming errors (e.g., FBC). During the program phase 820, incremental voltage pulses are applied to increase a voltage level of each voltage pulse (e.g., ISPP) to store a bit (e.g., 0 or 1) in a memory cell of a selected memory string until passing a verify phase (e.g., similar to verify phase shown in FIG. 6). During the verify phase (e.g., first verify step ($V_{fy}$) 620 shown in FIG. 6), the voltage level of each voltage pulse is compared (verified) to confirm whether the program phase was successful.

Suspend command (e.g., similar to suspend command 640 shown in FIG. 6.) can be received during program phase 820. Suspend command can initiate a suspend operation, for example, during program phase 820. In some aspects, the suspend operation can include storing (e.g., in cache) a programming voltage pulse count of the current program phase 820. In some aspects, the suspend operation can include completing the current program phase 820. In some aspects, the suspend operation can include applying clean pulse 830 to a selected memory string.

Clean pulse 830 can be configured to discharge one or more memory cells (e.g., memory cells 308) after the suspend command is received but prior to suspend phase 835, thereby decreasing a FBC of the memory device 108. Clean pulse 830 can be applied to discharge memory cells of a corresponding (selected) memory string (e.g., memory cells 308 of memory string 318 shown in FIG. 3). In some aspects, clean pulse 830 can be applied after a suspend operation (e.g., in response to the suspend command) is completed.

In some aspects, a voltage level and/or pulse width of clean pulse 830 can be adjustable, for example, according to different utilization scenarios. For example, the voltage level and pulse width of clean pulse 830 can be a fixed value. In some aspects, the fixed value can be pre-determined or determined by calibration, a mapping table, and/or dynamically adjusted accordingly to the specific utilization scenario, for example, the fixed value can be determined or adjusted based on a voltage (e.g., program voltage), a current (e.g., leakage current), a temperature (e.g., of memory cell 308), age (e.g., of memory cell 308), and/or a combination thereof.

Suspend phase 835 can be performed to suspend a program operation (e.g., write, read, etc.) on a given page of memory cells in order to read data from a separate page of memory cells (e.g., suspend read operation). In some aspects, suspend phase 835 can be configured to make memory controller 106 idle (e.g., stop program phase 820) and follow a separate command (e.g., suspend read operation) before entering a resume phase (e.g., similar to resume phase 550 shown in FIG. 5).

Timing diagram 802 can include programmed (selected) bit line ($BL_{pgm}$) 840, inhibited (unselected) bit line ($BL_{ihb}$) 842, selected top select gate ($TSG_{sel}$) 850, unselected top select gate ($TSG_{unsel}$) 852, selected word line ($WL_{sel}$) 860, unselected word line ($WL_{unsel}$) 862, and/or bottom select gate (BSG) 870. Unselected top select gate ($TSG_{unsel}$) 852 can be enabled in a discharge phase (e.g., clean pulse 830), which can discharge (release) charge (e.g., holes) accumulated on the memory cell and decrease programming errors (e.g., FBC) of the memory cell.

During program phase 820 from the periods $T_1$-$T_5$, a selected memory cell can be programmed by ramping selected word line ($WL_{sel}$) 860 to a pass voltage $V_{PASS}$ and then to a program voltage $V_{PGM}$, unselected word line ($WL_{unsel}$) 862 can be biased at the pass voltage $V_{PASS}$, programmed (selected) bit line ($BL_{pgm}$) 840 can be biased at a set level (e.g., ground level GND), inhibited (unselected) bit line ($BL_{ihb}$) 842 can be biased to an inhibit voltage $V_{dd}$, selected top select gate ($TSG_{sel}$) 850 can be biased at turn-on voltage $V_{tsg}$, unselected top select gate ($TSG_{unsel}$) 852 can be biased at a set level (e.g., ground level GND), and bottom select gate (BSG) 870 can be biased at a set level (e.g., ground level GND).

During clean pulse 830 from the periods $T_6$-$T_7$, selected word line ($WL_{sel}$) 860 can be biased to the pass voltage $V_{PASS}$, unselected word line ($WL_{unsel}$) 862 can be biased at the pass voltage $V_{PASS}$, programmed (selected) bit line ($BL_{pgm}$) 840 can be biased at a set level (e.g., ground level GND), inhibited (unselected) bit line ($BL_{ihb}$) 842 can be biased at a set level (e.g., ground level GND), selected top select gate ($TSG_{sel}$) 850 can be biased at turn-on voltage $V_{tsg}$, unselected top select gate ($TSG_{unsel}$) 852 can be biased at turn-on voltage $V_{ON1}$, and bottom select gate (BSG) 870 can be biased at turn-on voltage $V_{ON2}$.

In some aspects, operation method 800 can include programming memory cell 308 of memory device 108 (e.g., memory cell array 304 shown in FIG. 3) in program phase 820. For example, program phase 820 can include applying a plurality of program pulses (e.g., timing diagram 802) to memory cell 308. In some aspects, operation method 800 can include receiving a suspend command during program phase 820. For example, memory controller 106 can receive a suspend command (e.g., suspend command 640 shown in FIG. 6) during program phase 1620, for example, from host 104 or from memory controller 106 itself. In some aspects, operation method 800 can include discharging memory cell 308 in a discharge phase. For example, timing diagram 802 can include clean pulse 830 applied to memory cell 308 and configured to decrease charge accumulation on memory cell 308. In some aspects, clean pulse 830 can include a first voltage pulse to unselected top select gate ($TSG_{unsel}$) 852. For example, as shown in FIG. 8, clean pulse 830 can include timing diagram 802 with first voltage pulse (e.g., $V_{ON1}$) to unselected top select gate ($TSG_{unsel}$) 852. In some aspects, operation method 800 can include suspending programming of memory cell 308 in suspend phase 835.

In some aspects, unselected top select gate ($TSG_{unsel}$) 852 can decrease charge accumulation in memory cell 308 thereby decreasing a FBC of memory device 108. In some aspects, clean pulse 830 can include a merged discharge pulse based on an overlapping of a start of the discharge phase (e.g., clean pulse 830) and an end of program phase 820. For example, as shown in FIG. 9, merged clean pulse 930 can be applied to memory cell 308.

In some aspects, operation method 800 can further include reading a second memory cell (e.g., memory cell 308) of memory device 108 during suspend phase 835. In some aspects, operation method 800 can further include resuming programming of memory cell 308 in program phase 820.

In some aspects, clean pulse 830 can include a second voltage pulse to selected top select gate ($TSG_{sel}$) 850, a third voltage pulse to bottom select gate (BSG) 870, a fourth voltage pulse to unselected word line ($WL_{unsel}$) 862, and a fifth voltage pulse to selected word line ($WL_{sel}$) 860. For example, as shown in FIG. 8, clean pulse 830 can include timing diagram 802 with second voltage pulse (e.g., $V_{tsg}$) to selected top select gate ($TSG_{sel}$) 850, third voltage pulse (e.g., $V_{ON2}$) to bottom select gate (BSG) 870, fourth voltage pulse (e.g., $V_{PASS}$) to unselected word line ($WL_{unsel}$) 862, and fifth voltage pulse (e.g., $V_{PASS}$) to selected word line ($WL_{sel}$) 860.

In some aspects, first voltage pulse (e.g., $V_{ON1}$) to unselected top select gate ($TSG_{unsel}$) 852 and third voltage pulse (e.g., $V_{ON2}$) to bottom select gate (BSG) 870 can coincide with fifth voltage pulse (e.g., $V_{PASS}$) to selected word line ($WL_{sel}$) 860. In some aspects, first voltage pulse (e.g., $V_{ON1}$) to unselected top select gate ($TSG_{unsel}$) 852 and third voltage pulse (e.g., $V_{ON2}$) to bottom select gate (BSG) 870 can be enabled before fifth voltage pulse (e.g., $V_{PASS}$) to selected word line ($WL_{sel}$) 860. In some aspects, first voltage pulse (e.g., $V_{ON1}$) to unselected top select gate ($TSG_{unsel}$) 852 and third voltage pulse (e.g., $V_{ON2}$) to bottom select gate (BSG) 870 can be enabled after fifth voltage pulse (e.g., $V_{PASS}$) to selected word line ($WL_{sel}$) 860.

In some aspects, first voltage pulse (e.g., $V_{ON1}$) to unselected top select gate ($TSG_{unsel}$) 852, second voltage pulse (e.g., $V_{tsg}$) to selected top select gate ($TSG_{sel}$) 850, third voltage pulse (e.g., $V_{ON2}$) to bottom select gate (BSG) 870, fourth voltage pulse (e.g., $V_{PASS}$) to unselected word line ($WL_{unsel}$) 862, and fifth voltage pulse (e.g., $V_{PASS}$) to selected word line ($WL_{sel}$) 860 can be enabled simultaneously (e.g., clean pulse 830) thereby discharging memory cell 308 and decreasing charge accumulation in memory cell 308. For example, as shown in FIG. 8, clean pulse 830 can include timing diagram 802 between the periods $T_6$-$T_7$ where unselected top select gate ($TSG_{unsel}$) 852, selected top select gate ($TSG_{sel}$) 850, bottom select gate (BSG) 870, unselected word line ($WL_{unsel}$) 862, and selected word line ($WL_{sel}$) 860 all coincide and are enabled simultaneously.

In some aspects, a time duration of clean pulse 830 can be based on a tuning parameter configured to optimize the time duration and thereby decrease a FBC of memory device 108. In some aspects, the tuning parameter can include a period, an amplitude, a shape, a heuristically determined value, an experimentally determined value, and/or a combination thereof. For example, the tuning parameter can be predetermined or determined by calibration, a mapping table, and/or dynamically adjusted accordingly to a specific utilization scenario, for example, based on a voltage (e.g., program voltage), a current (e.g., leakage current), a temperature (e.g., of memory cell 308), age (e.g., of memory cell 308), and/or a combination thereof.

In some aspects, memory controller 106 can store program code (e.g., timing diagram 802) and be configured to implement operation method 800 on memory device 108. In some aspects, a suspend command from memory controller 106 can be received by memory device 108 during program phase 1620. In some aspects, memory controller 106 can apply a first voltage pulse (e.g., $V_{ON1}$) of unselected top select gate ($TSG_{unsel}$) 852 to implement clean pulse 830 on memory cell 308.

In some aspects, memory controller 106 can be further configured to verify memory cell 308 in a verify phase. For example, the verify phase (e.g., first verify step 620 shown in FIG. 6) can include verifying one or more voltage values of memory cell 308.

The aspects of operation method 800 shown in FIG. 8 and the aspects of operation method 900 shown in FIG. 9 may be similar. Similar reference numbers are used to indicate features of the aspects of operation method 800 shown in FIG. 8 and the similar features of the aspects of operation method 900 shown in FIG. 9. In some aspects, as shown in FIG. 9, operation method 900 can include merged clean pulse 930 rather than clean pulse 830 of operation method 800 shown in FIG. 8.

As shown in FIG. 9, operation method 900 can include timing diagram 902, program phase 920, program period 922, merged clean pulse 930, and suspend phase 935. Operation method 900 can receive a suspend command (e.g., similar to suspend command 740 shown in FIG. 7) during program phase 920. Merged clean pulse 930 can be applied after receiving the suspend command but prior to any subsequent memory operation (e.g., suspend read) to discharge memory cell and decrease programming errors (e.g., FBC). Further, merged clean pulse 930 can overlap an end of program phase 920 (e.g., period $T_4$) to reduce transient time between program phase 920 and merged clean pulse 930.

Merged clean pulse 930 can be configured to discharge one or more memory cells (e.g., memory cells 308) after the suspend command is received but prior to suspend phase 935, thereby decreasing a FBC of the memory device 108. Further, merged clean pulse 930, unlike clean pulse 830 shown in FIG. 8, can utilize and overlap voltage pulses in program phase 920 to reduce transient time (delay) between program phase 920 and suspend phase 935. Merged clean pulse 930 can be applied to discharge memory cells of a corresponding (selected) memory string (e.g., memory cells 308 of memory string 318 shown in FIG. 3). In some aspects, merged clean pulse 930 can be applied after a suspend operation (e.g., in response to the suspend command) is completed.

In some aspects, a voltage level and/or pulse width of merged clean pulse 930 can be adjustable, for example, according to different utilization scenarios. For example, the voltage level and pulse width of merged clean pulse 930 can be a fixed value. In some aspects, the fixed value can be pre-determined or determined by calibration, a mapping table, and/or dynamically adjusted accordingly to the specific utilization scenario, for example, the fixed value can be determined or adjusted based on a voltage (e.g., program voltage), a current (e.g., leakage current), a temperature (e.g., of memory cell 308), age (e.g., of memory cell 308), and/or a combination thereof.

Timing diagram 902 can include programmed (selected) bit line ($BL_{pgm}$) 940, inhibited (unselected) bit line ($BL_{ihb}$) 942, selected top select gate ($TSG_{sel}$) 950, unselected top select gate ($TSG_{unsel}$) 952, selected word line ($WL_{sel}$) 960, unselected word line ($WL_{unsel}$) 962, and/or bottom select gate (BSG) 970. Unselected top select gate ($TSG_{unsel}$) 952 can be enabled in a discharge phase (e.g., merged clean pulse 930), which can discharge (release) charge (e.g., holes) accumulated on the memory cell and decrease programming errors (e.g., FBC) of the memory cell.

During program phase 920 from the periods $T_1$-$T_4$, a selected memory cell can be programmed by ramping selected word line ($WL_{sel}$) 960 to a pass voltage $V_{PASS}$ and then to a program voltage $V_{PGM}$, unselected word line ($WL_{unsel}$) 962 can be biased at the pass voltage $V_{PASS}$, programmed (selected) bit line ($BL_{pgm}$) 940 can be biased at a set level (e.g., ground level GND), inhibited (unselected) bit line ($BL_{ihb}$) 942 can be biased to an inhibit voltage $V_{dd}$, selected top select gate ($TSG_{sel}$) 950 can be biased at turn-on voltage $V_{tsg}$, unselected top select gate ($TSG_{unsel}$) 952 can be biased at a set level (e.g., ground level GND), and bottom select gate (BSG) 970 can be biased at a set level (e.g., ground level GND).

During merged clean pulse 930 from the periods $T_4$-$T_6$, selected word line ($WL_{sel}$) 960 can be biased to the pass voltage $V_{PASS}$, unselected word line ($WL_{unsel}$) 962 can be biased at the pass voltage $V_{PASS}$, programmed (selected) bit line ($BL_{pgm}$) 940 can be biased at a set level (e.g., ground level GND), inhibited (unselected) bit line ($BL_{ihb}$) 942 can decrease from the inhibit voltage $V_{dd}$ to a set level (e.g., ground level GND), selected top select gate ($TSG_{sel}$) 950 can be biased at the turn-on voltage $V_{tsg}$, unselected top select gate ($TSG_{unsel}$) 952 can be biased at turn-on voltage $V_{ON1}$, and bottom select gate (BSG) 970 can be biased at turn-on voltage $V_{ON2}$.

In some aspects, operation method 900 can include programming memory cell 308 of memory device 108 (e.g., memory cell array 304 shown in FIG. 3) in program phase 920. For example, program phase 920 can include applying a plurality of program pulses (e.g., timing diagram 902) to memory cell 308. In some aspects, operation method 900 can include receiving a suspend command during program phase 920. For example, memory device 108 can receive a suspend command (e.g., suspend command 740 shown in FIG. 7) from memory controller 106 during program phase 920. In some aspects, operation method 900 can include discharging memory cell 308 in a discharge phase. For example, timing diagram 902 can include merged clean pulse 930 applied to memory cell 308 and configured to decrease charge accumulation on memory cell 308. In some aspects, merged clean pulse 930 can include a first voltage pulse to unselected top select gate ($TSG_{unsel}$) 952. For example, as shown in FIG. 9, merged clean pulse 930 can include timing diagram 902 with first voltage pulse (e.g., $V_{ON1}$) to unselected top select gate ($TSG_{unsel}$) 952. In some aspects, operation method 900 can include suspending programming of memory cell 308 in suspend phase 935.

In some aspects, unselected top select gate ($TSG_{unsel}$) 952 can decrease charge accumulation in memory cell 308 thereby decreasing a FBC of memory device 108. In some aspects, merged clean pulse 930 can decrease a time duration of suspend phase 935. For example, as shown in FIG. 9, merged clean pulse 930 can overlap with an end of program phase 920 (e.g., at period $T_4$).

In some aspects, operation method 900 can further include reading a second memory cell (e.g., memory cell 308) of memory device 108 during suspend phase 935. In some aspects, operation method 900 can further include resuming programming of memory cell 308 in program phase 920.

In some aspects, merged clean pulse 930 can include a second voltage pulse to selected top select gate ($TSG_{sel}$) 950, a third voltage pulse to bottom select gate (BSG) 970, a fourth voltage pulse to unselected word line ($WL_{unsel}$) 962, and a fifth voltage pulse to selected word line ($WL_{sel}$) 960. For example, as shown in FIG. 9, merged clean pulse 930 can include timing diagram 902 with second voltage pulse (e.g., $V_{tsg}$) to selected top select gate ($TSG_{sel}$) 950, third voltage pulse (e.g., $V_{ON2}$) to bottom select gate (BSG) 970, fourth voltage pulse (e.g., $V_{PASS}$) to unselected word line ($WL_{unsel}$) 962, and fifth voltage pulse (e.g., $V_{PASS}$) to selected word line ($WL_{sel}$) 960.

In some aspects, first voltage pulse (e.g., $V_{ON1}$) to unselected top select gate ($TSG_{unsel}$) 952 and third voltage pulse (e.g., $V_{ON2}$) to bottom select gate (BSG) 970 can coincide with fifth voltage pulse (e.g., $V_{PASS}$) to selected word line ($WL_{sel}$) 960. In some aspects, first voltage pulse (e.g., $V_{ON1}$)

to unselected top select gate (TSG$_{unsel}$) 952 and third voltage pulse (e.g., V$_{ON2}$) to bottom select gate (BSG) 970 can be enabled before fifth voltage pulse (e.g., V$_{PASS}$) to selected word line (WL$_{sel}$) 960. In some aspects, first voltage pulse (e.g., V$_{ON1}$) to unselected top select gate (TSG$_{unsel}$) 952 and third voltage pulse (e.g., V$_{ON2}$) to bottom select gate (BSG) 970 can be enabled after fifth voltage pulse (e.g., V$_{PASS}$) to selected word line (WL$_{sel}$) 960.

In some aspects, first voltage pulse (e.g., V$_{ON1}$) to unselected top select gate (TSG$_{unsel}$) 952, second voltage pulse (e.g., V$_{tsg}$) to selected top select gate (TSG$_{sel}$) 950, third voltage pulse (e.g., V$_{ON2}$) to bottom select gate (BSG) 970, fourth voltage pulse (e.g., V$_{PASS}$) to unselected word line (WL$_{unsel}$) 962, and fifth voltage pulse (e.g., V$_{PASS}$) to selected word line (WL$_{sel}$) 960 can be enabled simultaneously (e.g., merged clean pulse 930) thereby discharging memory cell 308 and decreasing charge accumulation in memory cell 308. For example, as shown in FIG. 9, merged clean pulse 930 can include timing diagram 902 between the periods T$_4$-T$_6$ where unselected top select gate (TSG$_{unsel}$) 952, selected top select gate (TSG$_{sel}$) 950, bottom select gate (BSG) 970, unselected word line (WL$_{unsel}$) 962, and selected word line (WL$_{sel}$) 960 all coincide and are enabled simultaneously.

In some aspects, a time duration of merged clean pulse 930 can be based on a tuning parameter configured to optimize the time duration and thereby decrease a FBC of memory device 108. In some aspects, the tuning parameter can include a period, an amplitude, a shape, a heuristically determined value, an experimentally determined value, and/or a combination thereof. For example, the tuning parameter can be pre-determined or determined by calibration, a mapping table, and/or dynamically adjusted accordingly to a specific utilization scenario, for example, based on a voltage (e.g., program voltage), a current (e.g., leakage current), a temperature (e.g., of memory cell 308), age (e.g., of memory cell 308), and/or a combination thereof.

In some aspects, memory controller 106 can store program code (e.g., timing diagram 902) and be configured to implement operation method 900 on memory device 108. In some aspects, a suspend command from memory controller 106 can be received by memory device 108 during program phase 920. In some aspects, memory controller 106 can apply a first voltage pulse (e.g., V$_{ON1}$) of unselected top select gate (TSG$_{unsel}$) 952 to implement merged clean pulse 930 on memory cell 308. In some aspects, merged clean pulse 930 can be based on an overlapping of a start of the discharge phase (e.g., at period T$_4$) and an end of program phase 920 (e.g., at period T$_4$).

In some aspects, memory controller 106 can be further configured to verify memory cell 308 in a verify phase. For example, the verify phase (e.g., first verify step 720 shown in FIG. 7) can include verifying one or more voltage values of memory cell 308.

Exemplary Operation Methods During Verify Phase

Figure 10:
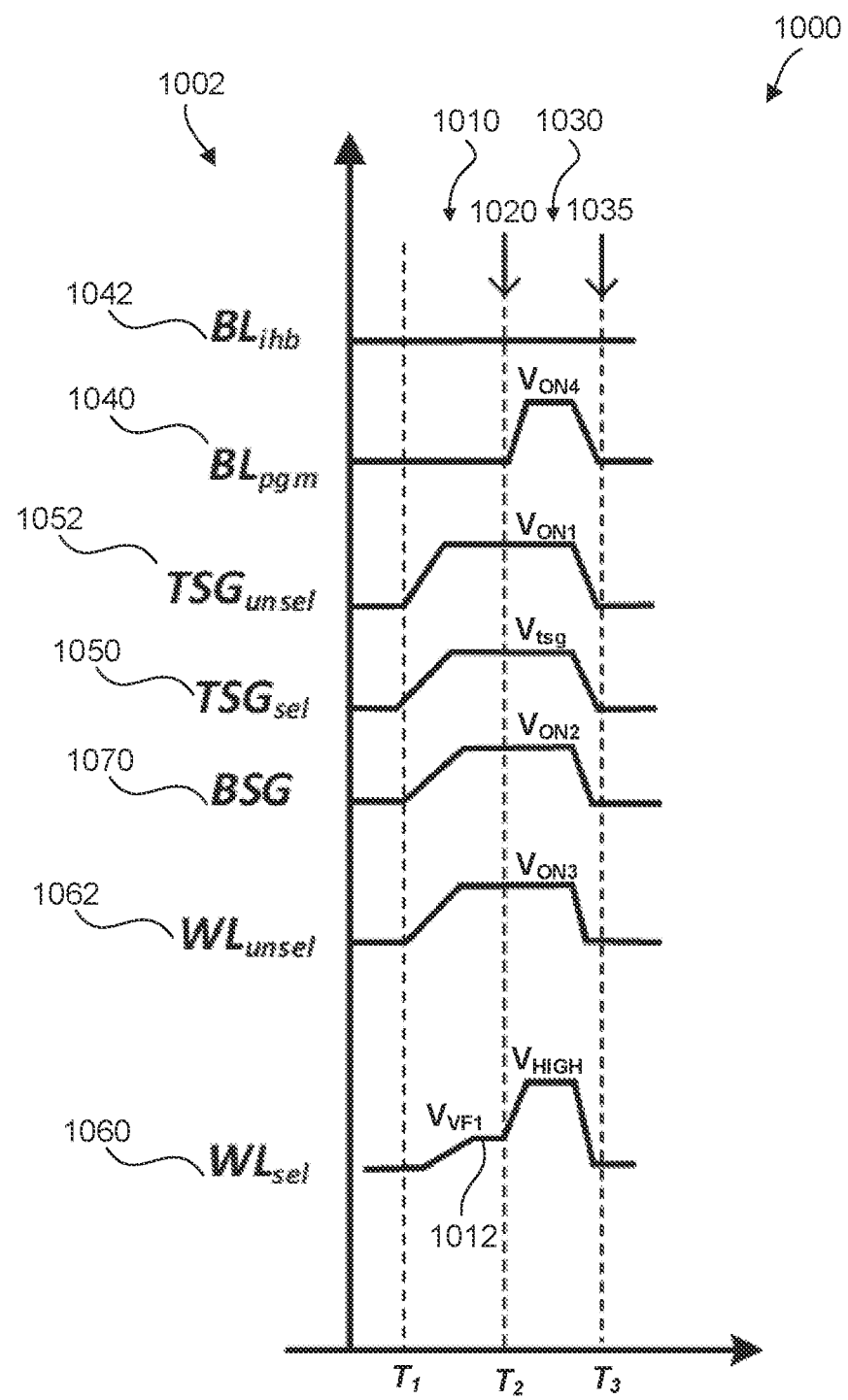
FIG. 10 is a schematic illustration of a timing diagram of an operation method of a memory device, according to an exemplary aspect.
Figure 11:
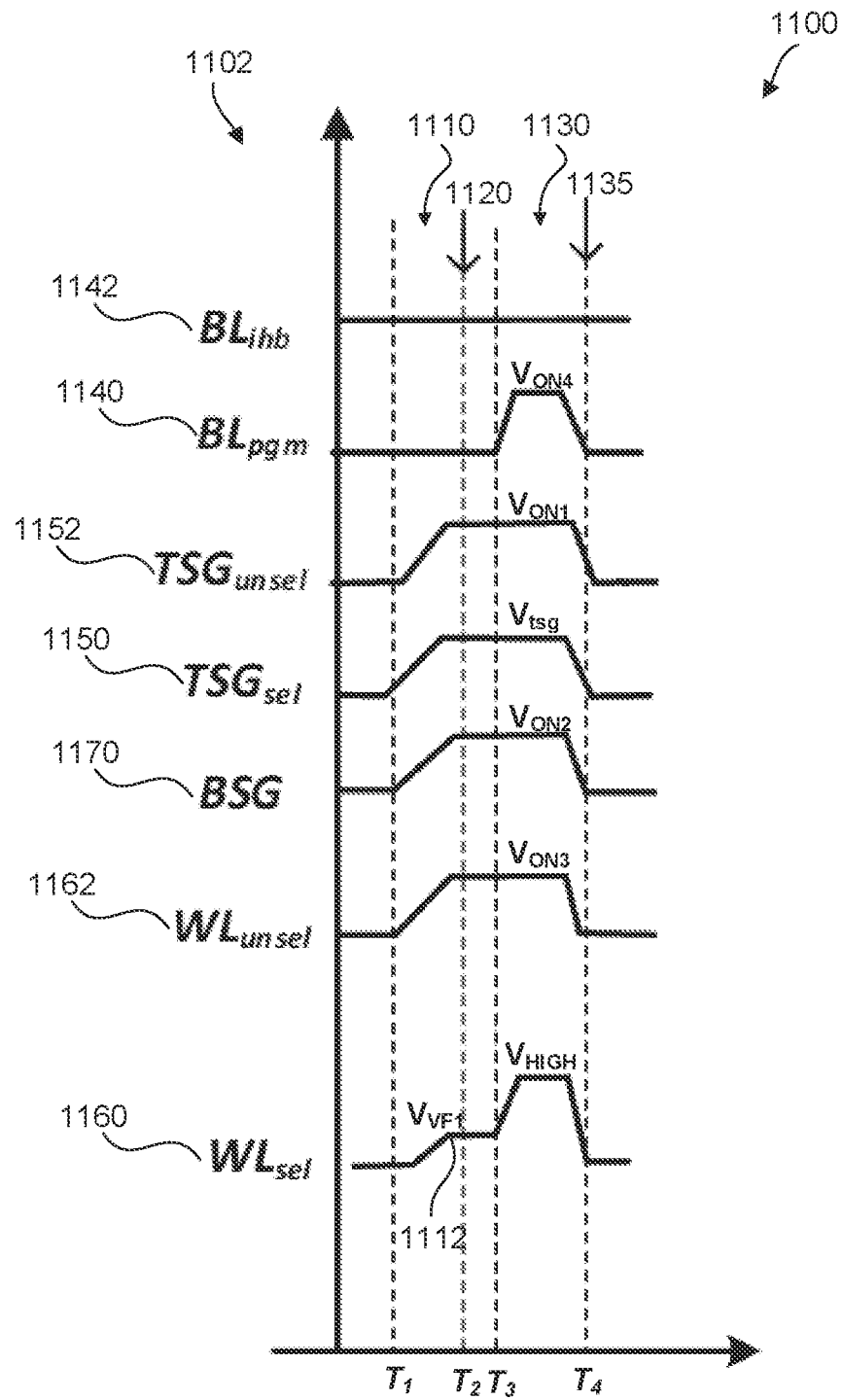
FIG. 11 is a schematic illustration of a timing diagram of an operation method of a memory device, according to an exemplary aspect.

FIGS. 10 and 11 illustrate operation methods 1000, 1100, according to various exemplary aspects. FIG. 10 is a schematic illustration of operation method 1000 with timing diagram 1002 of a program and verify process having merged clean pulse 1030, according to an exemplary aspect. FIG. 11 is a schematic illustration of operation method 1100 with timing diagram 1102 of a program and verify process having merged clean pulse 1130, according to an exemplary aspect.

Operation methods 1000, 1100 can be configured to increase verify suspending and resuming efficiency and decrease verify suspend times of memory system 100. Operation methods 1000, 1100 can be further configured to decrease a FBC of memory system 100.

Although operation methods 1000, 1100 are shown in FIGS. 10 and 11 as a stand-alone apparatus, system, and/or method, the aspects of this disclosure can be used with other apparatuses, systems, and/or methods, such as, but not limited to, memory system 100, memory controller 106, memory device 108, program and verify process 400, program and verify process 500, program and verify process 600, program and verify process 700, operation method 800, operation method 900, flow diagram 1200, and/or flow diagram 1300.

The aspects of operation method 900 shown in FIG. 9 and the aspects of operation method 1000 shown in FIG. 10 may be similar. Similar reference numbers are used to indicate features of the aspects of operation method 900 shown in FIG. 9 and the similar features of the aspects of operation method 1000 shown in FIG. 10. In some aspects, as shown in FIG. 10, operation method 1000 can include receiving suspend command 1020 during verify phase 1010 rather than during program phase 920 of operation method 900 shown in FIG. 9.

As shown in FIG. 10, operation method 1000 can include timing diagram 1002, verify phase 1010, verify state 1012 (e.g., at V$_{VF1}$), suspend command 1020, merged clean pulse 1030, and suspend phase 1035. Operation method 1000 can receive suspend command 1020 at the end of verify phase 1010 (e.g., at period T$_2$). During verify phase 1010, the voltage level of each voltage pulse (e.g., verify state 1012) is compared (verified) to confirm whether the program phase was successful (e.g., similar to program phase 920 shown in FIG. 9). Merged clean pulse 1030 can be applied after receiving suspend command 1020 but prior to any subsequent memory operation (e.g., suspend read) to discharge memory cell and decrease programming errors (e.g., FBC). Further, merged clean pulse 1030 can overlap an end of verify phase 1010 (e.g., period T$_2$) to reduce transient time between verify phase 1010 and merged clean pulse 1030.

Suspend command 1020 can be received during verify phase 1010. Suspend command 1020 can initiate a suspend operation during verify phase 1010 in response to receiving suspend command 1020 (e.g., from memory controller 106). In some aspects, the suspend operation can include immediately stopping verify phase 1010 (e.g., at verify state 1012 (V$_{VF1}$)) to decrease a time interval between receiving suspend command 1020 and entering suspend phase 1035 (e.g., suspend read operation). In some aspects, the suspend operation can include applying merged clean pulse 1030 to a selected memory string. In some aspects, the suspend operation can include storing (e.g., in cache) the verify state 1012 (e.g., at V$_{VF1}$) before applying merged clean pulse 1030. In some aspects, the suspend operation can include completing the entire verify phase 1010 (e.g., similar to first verify step (V$_{fy}$) 720 shown in FIG. 7) before applying merged clean pulse 1030.

Merged clean pulse 1030 can be configured to discharge one or more memory cells (e.g., memory cells 308) after suspend command 1020 is received but prior to suspend phase 1035, thereby decreasing a FBC of the memory device 108. Further, merged clean pulse 1030, unlike clean pulse 830 shown in FIG. 8, can utilize and overlap voltage pulses in verify phase 1010 to reduce transient time (delay) between verify phase 1010 and suspend phase 1035. Merged clean pulse 1030 can be applied to discharge memory cells of a corresponding (selected) memory string (e.g., memory cells 308 of memory string 318 shown in FIG. 3). In some aspects, merged clean pulse 1030 can be applied after a suspend operation (e.g., in response to suspend command 1020) is completed.

In some aspects, a voltage level and/or pulse width of merged clean pulse 1030 can be adjustable, for example, according to different utilization scenarios. For example, the voltage level and pulse width of merged clean pulse 1030 can be a fixed value. In some aspects, the fixed value can be pre-determined or determined by calibration, a mapping table, and/or dynamically adjusted accordingly to the specific utilization scenario, for example, the fixed value can be determined or adjusted based on a voltage (e.g., program voltage), a current (e.g., leakage current), a temperature (e.g., of memory cell 308), age (e.g., of memory cell 308), and/or a combination thereof.

Suspend phase 1035 can be performed to suspend a verify phase 1010 on a given page of memory cells in order to read data from a separate page of memory cells (e.g., suspend read operation). In some aspects, suspend phase 1035 can be configured to make memory controller 106 idle (e.g., stop verify phase 1010) and follow a separate command (e.g., suspend operation, suspend read operation) before entering a resume phase (e.g., similar to resume phase 550 shown in FIG. 5).

Timing diagram 1002 can include programmed (selected) bit line ($BL_{pgm}$) 1040, inhibited (unselected) bit line ($BL_{ihb}$) 1042, selected top select gate ($TSG_{sel}$) 1050, unselected top select gate ($TSG_{unsel}$) 1052, selected word line ($WL_{sel}$) 1060, unselected word line ($WL_{unsel}$) 1062, and/or bottom select gate (BSG) 1070. Unselected top select gate ($TSG_{unsel}$) 1052 can be enabled in a discharge phase (e.g., merged clean pulse 1030), which can discharge (release) charge (e.g., holes) accumulated on the memory cell and decrease programming errors (e.g., FBC) of the memory cell.

During verify phase 1010 from the periods $T_1$-$T_2$, a selected memory cell can be verified by reading selected word line ($WL_{sel}$) 1060 at verify state 1012 (e.g., at $V_{VF1}$), unselected word line ($WL_{unsel}$) 1062 can be ramped to turn-on voltage $V_{ON3}$, programmed (selected) bit line ($BL_{pgm}$) 1040 can be biased at a set level (e.g., ground level GND), inhibited (unselected) bit line ($BL_{ihb}$) 1042 can be biased at a set level (e.g., ground level GND), selected top select gate ($TSG_{sel}$) 1050 can be ramped to turn-on voltage $V_{tsg}$, unselected top select gate ($TSG_{unsel}$) 1052 can be ramped to turn-on voltage $V_{ON1}$, and bottom select gate (BSG) 1070 can be ramped to turn-on voltage $V_{ON2}$. Suspend command 1020 can be received at the end of verify state 1012 (e.g., at $V_{VF1}$) at the period $T_2$.

During merged clean pulse 1030 from the periods $T_2$-$T_3$, selected word line ($WL_{sel}$) 1060 can be ramped to a high voltage $V_{HIGH}$, unselected word line ($WL_{unsel}$) 1062 can be biased at the turn-on voltage $V_{ON3}$, programmed (selected) bit line ($BL_{pgm}$) 1040 can be ramped to turn-on voltage $V_{ON4}$, inhibited (unselected) bit line ($BL_{ihb}$) 1042 can be biased at a set level (e.g., ground level GND), selected top select gate ($TSG_{sel}$) 1050 can be biased at the turn-on voltage $V_{tsg}$, unselected top select gate ($TSG_{unsel}$) 1052 can be biased at turn-on voltage $V_{ON1}$, and bottom select gate (BSG) 1070 can be biased at turn-on voltage $V_{ON2}$. After merged clean pulse 1030 has been applied, programmed (selected) bit line ($BL_{pgm}$) 1040, unselected top select gate ($TSG_{unsel}$) 1052, selected top select gate ($TSG_{sel}$) 1050, bottom select gate (BSG) 1070, unselected word line ($WL_{unsel}$) 1062, and selected word line ($WL_{sel}$) 1060 can decrease to a set level (e.g., ground level GND) and the memory cell can enter suspend phase 1035.

As shown in FIG. 10, programmed (selected) bit line ($BL_{pgm}$) 1040 can be biased from period $T_2$ (e.g., at suspend command 1020) to period $T_3$, unselected top select gate ($TSG_{unsel}$) 1052 can be biased from period $T_1$ (e.g., prior to suspend command 1020) to period $T_3$, selected top select gate ($TSG_{sel}$) 1050 can be biased from period $T_1$ (e.g., prior to suspend command 1020) to period $T_3$, bottom select gate (BSG) 1070 can be biased from period $T_1$ (e.g., prior to suspend command 1020) to period $T_3$, unselected word line ($WL_{unsel}$) 1062 can be biased from period $T_1$ (e.g., prior to suspend command 1020) to period $T_3$, and selected word line ($WL_{sel}$) 1060 can be biased from period $T_2$ (e.g., at suspend command 1020) to period $T_3$.

In some aspects, operation method 1000 can include programming memory cell 308 of memory device 108 (e.g., memory cell array 304 shown in FIG. 3) in a program phase. In some aspects, operation method 1000 can include verifying memory cell 308 in verify phase 1010. For example, verify phase 1010 can include verifying a voltage value (e.g., verify state 1012) on memory cell 308. In some aspects, operation method 1000 can include receiving suspend command 1020 during verify phase 1010. For example, as shown in FIG. 10, memory device 108 can receive suspend command 1020 from memory controller 106 at an end of verify phase 1010 (e.g., at period $T_2$). In some aspects, operation method 1000 can include discharging memory cell 308 in a discharge phase. For example, timing diagram 1002 can include merged clean pulse 1030 applied to memory cell 308 and configured to decrease charge accumulation on memory cell 308. In some aspects, merged clean pulse 1030 can include a first voltage pulse to unselected top select gate ($TSG_{unsel}$) 1052. For example, as shown in FIG. 10, merged clean pulse 1030 can include timing diagram 1002 with first voltage pulse (e.g., $V_{ON1}$) to unselected top select gate ($TSG_{unsel}$) 1052. In some aspects, operation method 1000 can include suspending verifying of memory cell 308 in suspend phase 1035.

In some aspects, unselected top select gate ($TSG_{unsel}$) 1052 can decrease charge accumulation in memory cell 308 thereby decreasing a FBC of memory device 108. In some aspects, merged clean pulse 1030 can decrease a time duration of suspend phase 1035. For example, as shown in FIG. 10, merged clean pulse 1030 can overlap with an end of verify phase 1010 (e.g., at period $T_2$).

In some aspects, operation method 1000 can further include reading a second memory cell (e.g., memory cell 308) of memory device 108 during suspend phase 1035. In some aspects, operation method 1000 can further include resuming verifying of memory cell 308 in verify phase 1010.

In some aspects, operation method 1000 can include immediately stopping verify phase 1010 at verify state 1012 after receiving suspend command 1020 thereby decreasing a time interval of suspend phase 1035. In some aspects, operation method 1000 can further include resuming verify phase 1010 at a second verify state after verify state 1012. In some aspects, operation method 1000 can further include storing verify state 1012 (e.g., $V_{VF1}$) before applying merged clean pulse 1030 (e.g., at period $T_2$). In some aspects, operation method 1000 can further include reinitiating the entire verify phase 1010. For example, after ending suspend phase 1035 (e.g., resuming verify phase 1010), verify state 1012 and subsequent verify states can be reinitiated and verified again.

In some aspects, merged clean pulse 1030 can include a second voltage pulse to selected top select gate ($TSG_{sel}$) 1050, a third voltage pulse to bottom select gate (BSG) 1070, a fourth voltage pulse to unselected word line (WL$_{unsel}$) 1062, and a fifth voltage pulse to selected word line (WL$_{sel}$) 1060. For example, as shown in FIG. 10, merged clean pulse 1030 can include timing diagram 1002 with second voltage pulse (e.g., V$_{tsg}$) to selected top select gate (TSG$_{sel}$) 1050, third voltage pulse (e.g., V$_{ON2}$) to bottom select gate (BSG) 1070, fourth voltage pulse (e.g., V$_{ON3}$) to unselected word line (WL$_{sel}$) 1062, and fifth voltage pulse (e.g., V$_{HIGH}$) to selected word line (WL$_{sel}$) 1060.

In some aspects, first voltage pulse (e.g., V$_{ON1}$) to unselected top select gate (TSG$_{unsel}$) 1052 and third voltage pulse (e.g., V$_{ON2}$) to bottom select gate (BSG) 1070 can coincide with fifth voltage pulse (e.g., V$_{HIGH}$) to selected word line (WL$_{sel}$) 1060. In some aspects, first voltage pulse (e.g., V$_{ON1}$) to unselected top select gate (TSG$_{unsel}$) 1052 and third voltage pulse (e.g., V$_{ON2}$) to bottom select gate (BSG) 1070 can be enabled before fifth voltage pulse (e.g., V$_{HIGH}$) to selected word line (WL$_{sel}$) 1060. In some aspects, first voltage pulse (e.g., V$_{ON1}$) to unselected top select gate (TSG$_{unsel}$) 1052 and third voltage pulse (e.g., V$_{ON2}$) to bottom select gate (BSG) 1070 can be enabled after fifth voltage pulse (e.g., V$_{HIGH}$) to selected word line (WL$_{sel}$) 1060.

In some aspects, first voltage pulse (e.g., V$_{ON1}$) to unselected top select gate (TSG$_{unsel}$) 1052, second voltage pulse (e.g., V$_{tsg}$) to selected top select gate (TSG$_{sel}$) 1050, third voltage pulse (e.g., V$_{ON2}$) to bottom select gate (BSG) 1070, fourth voltage pulse (e.g., V$_{ON3}$) to unselected word line (WL$_{unsel}$) 1062, and fifth voltage pulse (e.g., V$_{HIGH}$) to selected word line (WL$_{sel}$) 1060 can be enabled simultaneously (e.g., merged clean pulse 1030) thereby discharging memory cell 308 and decreasing charge accumulation in memory cell 308. For example, as shown in FIG. 10, merged clean pulse 1030 can include timing diagram 1002 between the periods T$_2$-T$_3$ where unselected top select gate (TSG$_{unsel}$) 1052, selected top select gate (TSG$_{sel}$) 1050, bottom select gate (BSG) 1070, unselected word line (WL$_{unsel}$) 1062, and selected word line (WL$_{sel}$) 1060 all coincide and are enabled simultaneously.

In some aspects, a time duration of merged clean pulse 1030 can be based on a tuning parameter configured to optimize the time duration and thereby decrease a FBC of memory device 108. In some aspects, the tuning parameter can include a period, an amplitude, a shape, a heuristically determined value, an experimentally determined value, and/or a combination thereof. For example, the tuning parameter can be pre-determined or determined by calibration, a mapping table, and/or dynamically adjusted accordingly to a specific utilization scenario, for example, based on a voltage (e.g., program voltage), a current (e.g., leakage current), a temperature (e.g., of memory cell 308), age (e.g., of memory cell 308), and/or a combination thereof.

In some aspects, merged clean pulse 1030 can be based on an overlapping of a start of the discharge pulse (e.g., at period T$_2$) and an end of verify phase 1010 (e.g., at period T$_2$). In some aspects, as shown in FIG. 10, suspend command 1020 can be received at an end of verify phase 1010 (e.g., at period T$_2$), at a start of a sixth voltage pulse (e.g., V$_{ON4}$) to programmed (selected) bit line (BL$_{pgm}$) 1040, and during first voltage pulse (e.g., V$_{ON1}$) to unselected top select gate (TSG$_{unsel}$) 1052. In some aspects, suspend command 1020 can be received during verify phase 1010 (e.g., between periods T$_1$-T$_2$), before a start of sixth voltage pulse (e.g., V$_{ON4}$) to programmed (selected) bit line (BL$_{pgm}$) 1040, and during first voltage pulse (e.g., V$_{ON1}$) to unselected top select gate (TSG$_{unsel}$) 1052.

In some aspects, memory controller 106 can store program code (e.g., timing diagram 1002) and be configured to implement operation method 1000 on memory device 108. In some aspects, suspend command 1020 from memory controller 106 can be received by memory device 108 during verify phase 1010. In some aspects, as shown in FIG. 10, memory controller 106 can be configured to immediately stop verify phase 1010 at verify state 1012 after sending suspend command 1020 to memory device 108 thereby decreasing a time interval of suspend phase 1035. In some aspects, memory controller 106 can be configured to complete the entire verify phase 1010 after sending suspend command 1020 to memory device 108 before applying merged clean pulse 1030.

In some aspects, memory controller 106 can apply a first voltage pulse (e.g., V$_{ON1}$) of unselected top select gate (TSG$_{unsel}$) 1052 to implement merged clean pulse 1030 on memory cell 308. In some aspects, merged clean pulse 1030 can be based on an overlapping of a start of the discharge phase (e.g., at period T$_2$) and an end of verify phase 1010 (e.g., at period T$_2$).

The aspects of operation method 1000 shown in FIG. 10 and the aspects of operation method 1100 shown in FIG. 11 may be similar. Similar reference numbers are used to indicate features of the aspects of operation method 1000 shown in FIG. 10 and the similar features of the aspects of operation method 1100 shown in FIG. 11.

As shown in FIG. 11, operation method 1100 can include timing diagram 1102, verify phase 1110, verify state 1112 (e.g., at V$_{VF1}$), suspend command 1120, merged clean pulse 1130, and suspend phase 1135. Operation method 1100 can receive suspend command 1120 during verify phase 1110 (e.g., at period T$_2$). Merged clean pulse 1130 can be applied after receiving suspend command 1120 but prior to any subsequent memory operation (e.g., suspend read) to discharge memory cell and decrease programming errors (e.g., FBC). Further, merged clean pulse 1130 can overlap an end of verify phase 1110 (e.g., period T$_3$) to reduce transient time between verify phase 1110 and merged clean pulse 1130. Timing diagram 1102 can include programmed (selected) bit line (BL$_{pgm}$) 1140, inhibited (unselected) bit line (BL$_{ihb}$) 1142, selected top select gate (TSG$_{sel}$) 1150, unselected top select gate (TSG$_{unsel}$) 1152, selected word line (WL$_{sel}$) 1160, unselected word line (WL$_{unsel}$) 1162, and/or bottom select gate (BSG) 1170. Unselected top select gate (TSG$_{unsel}$) 1152 can be enabled in a discharge phase (e.g., merged clean pulse 1130), which can discharge (release) charge (e.g., holes) accumulated on the memory cell and decrease programming errors (e.g., FBC) of the memory cell.

During verify phase 1110 from the periods T$_1$-T$_3$, a selected memory cell can be verified by reading selected word line (WL$_{sel}$) 1160 at verify state 1112 (e.g., at V$_{VF1}$), unselected word line (WL$_{unsel}$) 1162 can be ramped to turn-on voltage V$_{ON3}$, programmed (selected) bit line (BL$_{pgm}$) 1140 can be biased at a set level (e.g., ground level GND), inhibited (unselected) bit line (BL$_{ihb}$) 1142 can be biased at a set level (e.g., ground level GND), selected top select gate (TSG$_{sel}$) 1150 can be ramped to turn-on voltage V$_{tsg}$, unselected top select gate (TSG$_{unsel}$) 1152 can be ramped to turn-on voltage V$_{ON1}$, and bottom select gate (BSG) 1170 can be ramped to turn-on voltage V$_{ON2}$. Suspend command 1120 can be received during verify state 1112 (e.g., at V$_{VF1}$) at the period T$_2$.

During merged clean pulse 1130 from the periods T$_3$-T$_4$, selected word line (WL$_{sel}$) 1160 can be ramped to a high voltage V$_{HIGH}$, unselected word line (WL$_{unsel}$) 1162 can be biased at the turn-on voltage V$_{ON3}$, programmed (selected)

bit line (BL$_{pgm}$) 1140 can be ramped to turn-on voltage V$_{ON4}$, inhibited (unselected) bit line (BL$_{ihb}$) 1142 can be biased at a set level (e.g., ground level GND), selected top select gate (TSG$_{sel}$) 1150 can be biased at the turn-on voltage V$_{tsg}$, unselected top select gate (TSG$_{unsel}$) 1152 can be biased at turn-on voltage V$_{ON1}$, and bottom select gate (BSG) 1170 can be biased at turn-on voltage V$_{ON2}$. After merged clean pulse 1130 has been applied, programmed (selected) bit line (BL$_{pgm}$) 1140, unselected top select gate (TSG$_{unsel}$) 1152, selected top select gate (TSG$_{sel}$) 1150, bottom select gate (BSG) 1170, unselected word line (WL$_{unsel}$) 1162, and selected word line (WL$_{sel}$) 1160 can decrease to a set level (e.g., ground level GND) and the memory cell can enter suspend phase 1135.

As shown in FIG. 11, programmed (selected) bit line (BL$_{pgm}$) 1140 can be biased from period T$_3$ (e.g., after suspend command 1120) to period T$_4$, unselected top select gate (TSG$_{unsel}$) 1152 can be biased from period T$_1$ (e.g., prior to suspend command 1120) to period T$_4$, selected top select gate (TSG$_{sel}$) 1150 can be biased from period T$_1$ (e.g., prior to suspend command 1120) to period T$_4$, bottom select gate (BSG) 1170 can be biased from period T$_1$ (e.g., prior to suspend command 1120) to period T$_4$, unselected word line (WL$_{unsel}$) 1162 can be biased from period T$_1$ (e.g., prior to suspend command 1120) to period T$_4$, and selected word line (WL$_{sel}$) 1160 can be biased from period T$_3$ (e.g., after suspend command 1120) to period T$_4$.

In some aspects, operation method 1100 can include programming memory cell 308 of memory device 108 (e.g., memory cell array 304 shown in FIG. 3) in a program phase. In some aspects, operation method 1100 can include verifying memory cell 308 in verify phase 1110. For example, verify phase 1110 can include verifying a voltage value (e.g., verify state 1112) on memory cell 308. In some aspects, operation method 1100 can include receiving suspend command 1120 during verify phase 1110. For example, as shown in FIG. 11, memory device 108 can receive suspend command 1120 from memory controller 106 during verify phase 1110 (e.g., at period T$_2$). In some aspects, operation method 1100 can include discharging memory cell 308 in a discharge phase. For example, timing diagram 1102 can include merged clean pulse 1130 applied to memory cell 308 and configured to decrease charge accumulation on memory cell 308. In some aspects, merged clean pulse 1130 can include a first voltage pulse to unselected top select gate (TSG$_{unsel}$) 1152. For example, as shown in FIG. 11, merged clean pulse 1130 can include timing diagram 1102 with first voltage pulse (e.g., V$_{ON1}$) to unselected top select gate (TSG$_{unsel}$) 1152. In some aspects, operation method 1100 can include suspending verifying of memory cell 308 in suspend phase 1135.

In some aspects, unselected top select gate (TSG$_{unsel}$) 1152 can decrease charge accumulation in memory cell 308 thereby decreasing a FBC of memory device 108. In some aspects, merged clean pulse 1130 can decrease a time duration of suspend phase 1135. For example, as shown in FIG. 11, merged clean pulse 1130 can overlap with an end of verify phase 1110 (e.g., at period T$_3$).

In some aspects, operation method 1100 can further include reading a second memory cell (e.g., memory cell 308) of memory device 108 during suspend phase 1135. In some aspects, operation method 1100 can further include resuming verifying of memory cell 308 in verify phase 1110.

In some aspects, operation method 1100 can include immediately stopping verify phase 1110 at verify state 1112 after receiving suspend command 1120 thereby decreasing a time interval of suspend phase 1135. In some aspects, operation method 1100 can further include resuming verify phase 1110 at a second verify state after verify state 1112. In some aspects, operation method 1100 can further include storing verify state 1112 (e.g., V$_{VF1}$) before applying merged clean pulse 1130 (e.g., at period T$_3$). In some aspects, operation method 1100 can further include reinitiating the entire verify phase 1110. For example, after ending suspend phase 1135 (e.g., resuming verify phase 1110), verify state 1112 and subsequent verify states can be reinitiated and verified again.

In some aspects, merged clean pulse 1130 can include a second voltage pulse to selected top select gate (TSG$_{sel}$) 1150, a third voltage pulse to bottom select gate (BSG) 1170, a fourth voltage pulse to unselected word line (WL$_{unsel}$) 1162, and a fifth voltage pulse to selected word line (WL$_{sel}$) 1160. For example, as shown in FIG. 11, merged clean pulse 1130 can include timing diagram 1102 with second voltage pulse (e.g., V$_{tsg}$) to selected top select gate (TSG$_{sel}$) 1150, third voltage pulse (e.g., V$_{ON2}$) to bottom select gate (BSG) 1170, fourth voltage pulse (e.g., V$_{ON3}$) to unselected word line (WL$_{unsel}$) 1162, and fifth voltage pulse (e.g., V$_{HIGH}$) to selected word line (WL$_{sel}$) 1160.

In some aspects, first voltage pulse (e.g., V$_{ON1}$) to unselected top select gate (TSG$_{unsel}$) 1152 and third voltage pulse (e.g., V$_{ON2}$) to bottom select gate (BSG) 1170 can coincide with fifth voltage pulse (e.g., V$_{HIGH}$) to selected word line (WL$_{sel}$) 1160. In some aspects, first voltage pulse (e.g., V$_{ON1}$) to unselected top select gate (TSG$_{unsel}$) 1152 and third voltage pulse (e.g., V$_{ON2}$) to bottom select gate (BSG) 1170 can be enabled before fifth voltage pulse (e.g., V$_{HIGH}$) to selected word line (WL$_{sel}$) 1160. In some aspects, first voltage pulse (e.g., V$_{ON1}$) to unselected top select gate (TSG$_{unsel}$) 1152 and third voltage pulse (e.g., V$_{ON2}$) to bottom select gate (BSG) 1170 can be enabled after fifth voltage pulse (e.g., V$_{HIGH}$) to selected word line (WL$_{sel}$) 1160.

In some aspects, first voltage pulse (e.g., V$_{ON1}$) to unselected top select gate (TSG$_{unsel}$) 1152, second voltage pulse (e.g., V$_{tsg}$) to selected top select gate (TSG$_{sel}$) 1150, third voltage pulse (e.g., V$_{ON2}$) to bottom select gate (BSG) 1170, fourth voltage pulse (e.g., V$_{ON3}$) to unselected word line (WL$_{unsel}$) 1162, and fifth voltage pulse (e.g., V$_{HIGH}$) to selected word line (WL$_{sel}$) 1160 can be enabled simultaneously (e.g., merged clean pulse 1130) thereby discharging memory cell 308 and decreasing charge accumulation in memory cell 308. For example, as shown in FIG. 11, merged clean pulse 1130 can include timing diagram 1102 between the periods T$_3$-T$_4$ where unselected top select gate (TSG$_{unsel}$) 1152, selected top select gate (TSG$_{sel}$) 1150, bottom select gate (BSG) 1170, unselected word line (WL$_{unsel}$) 1162, and selected word line (WL$_{sel}$) 1160 all coincide and are enabled simultaneously.

In some aspects, a time duration of merged clean pulse 1130 can be based on a tuning parameter configured to optimize the time duration and thereby decrease a FBC of memory device 108. In some aspects, the tuning parameter can include a period, an amplitude, a shape, a heuristically determined value, an experimentally determined value, and/or a combination thereof. For example, the tuning parameter can be pre-determined or determined by calibration, a mapping table, and/or dynamically adjusted accordingly to a specific utilization scenario, for example, based on a voltage (e.g., program voltage), a current (e.g., leakage current), a temperature (e.g., of memory cell 308), age (e.g., of memory cell 308), and/or a combination thereof.

In some aspects, merged clean pulse 1130 can be based on an overlapping of a start of the discharge pulse (e.g., at period T$_3$) and an end of verify phase 1110 (e.g., at period T$_3$). In some aspects, suspend command 1120 can be received at an end of verify phase 1110 (e.g., at period T$_3$), at a start of a sixth voltage pulse (e.g., V$_{ON4}$) to programmed (selected) bit line (BL$_{pgm}$) 1140, and during first voltage pulse (e.g., V$_{ON1}$) to unselected top select gate (TSG$_{unsel}$) 1152. In some aspects, as shown in FIG. 11, suspend command 1120 can be received during verify phase 1110 (e.g., between periods T$_1$-T$_3$, at period T$_2$), before a start of sixth voltage pulse (e.g., V$_{ON4}$) to programmed (selected) bit line (BL$_{pgm}$) 1140, and during first voltage pulse (e.g., V$_{ON1}$) to unselected top select gate (TSG$_{unsel}$) 1152.

In some aspects, memory controller 106 can store program code (e.g., timing diagram 1102) and be configured to implement operation method 1100 on memory device 108. In some aspects, suspend command 1120 from memory controller 106 can be received by memory device 108 during verify phase 1110. In some aspects, memory controller 106 can be configured to immediately stop verify phase 1110 at verify state 1112 after sending suspend command 1120 to memory device 108 thereby decreasing a time interval of suspend phase 1135. In some aspects, as shown in FIG. 11, memory controller 106 can be configured to complete the entire verify phase 1110 (e.g., complete verify state 1112) after sending suspend command 1120 to memory device 108 before applying merged clean pulse 1130.

In some aspects, memory controller 106 can apply a first voltage pulse (e.g., V$_{ON1}$) of unselected top select gate (TSG$_{unsel}$) 1152 to implement merged clean pulse 1130 on memory cell 308. In some aspects, merged clean pulse 1130 can be based on an overlapping of a start of the discharge phase (e.g., at period T$_3$) and an end of verify phase 1110 (e.g., at period T$_3$).

Exemplary Flow Diagrams

Figure 12:
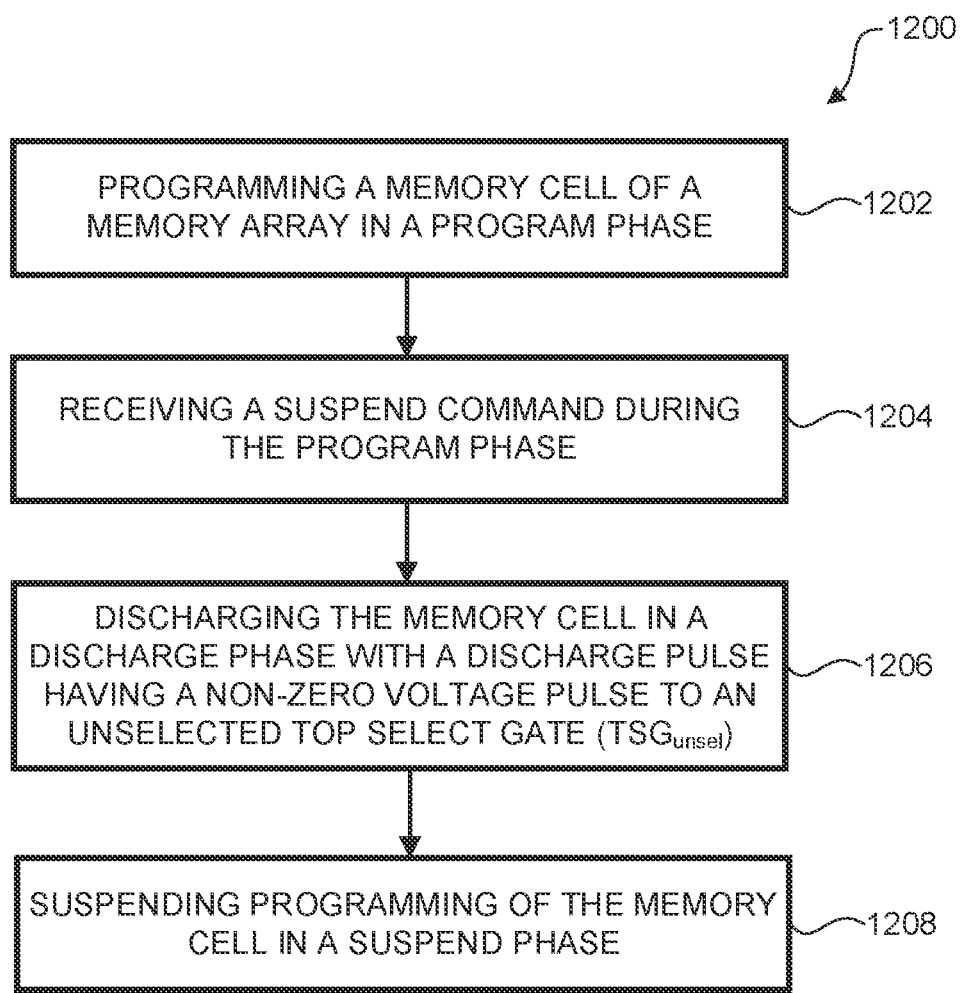
FIG. 12 illustrates a flow diagram for an operation method, according to an exemplary aspect.

FIG. 12 illustrates flow diagram 1200 for operation methods 800, 900 shown in FIGS. 8 and 9, according to exemplary aspects. It is to be appreciated that not all steps in FIG. 12 are needed to perform the disclosure provided herein. Further, some of the steps may be performed simultaneously, sequentially, and/or in a different order than shown in FIG. 12. Flow diagram 1200 shall be described with reference to FIGS. 1-3, 8, and 9. However, flow diagram 1200 is not limited to those example aspects.

In step 1202, as shown in the example of FIGS. 1-3, 8, and 9, memory controller 106 can program one or more memory cells 308 of memory device 108 of memory system 100 in a program phase. In some aspects, memory controller 106 can apply timing diagram 802 to memory cell 308 of memory device 108 in program phase 820. In some aspects, memory controller 106 can apply timing diagram 902 to memory cell 308 of memory device 108 in program phase 920.

In step 1204, as shown in the example of FIGS. 1-3, 8, and 9, memory controller 106 can send a suspend command to memory device 108 during the program phase. In some aspects, memory device 108 (e.g., memory cell 308) can receive a suspend command during program phase 820. In some aspects, memory device 108 (e.g., memory cell 308) can receive a suspend command during program phase 920.

In step 1206, as shown in the example of FIGS. 1-3, 8, and 9, memory controller 106 can discharge one or more memory cells 308 of memory device 108 with a discharge pulse having a first voltage pulse to an unselected top select gate (TSG$_{unsel}$). In some aspects, memory device 108 (e.g., memory cell 308) can receive clean pulse 830 with biased unselected top select gate (TSG$_{unsel}$) 852. In some aspects, memory device 108 (e.g., memory cell 308) can receive merged clean pulse 930 with biased unselected top select gate (TSG$_{unsel}$) 952.

In step 1208, as shown in the example of FIGS. 1-3, 8, and 9, memory controller 106 can suspend programming of one or more memory cells 308 of memory device 108 in a suspend phase. In some aspects, memory device 108 (e.g., memory cell 308) can enter suspend phase 835 after clean pulse 830. In some aspects, memory device 108 (e.g., memory cell 308) can enter suspend phase 935 after merged clean pulse 930.

Figure 13:
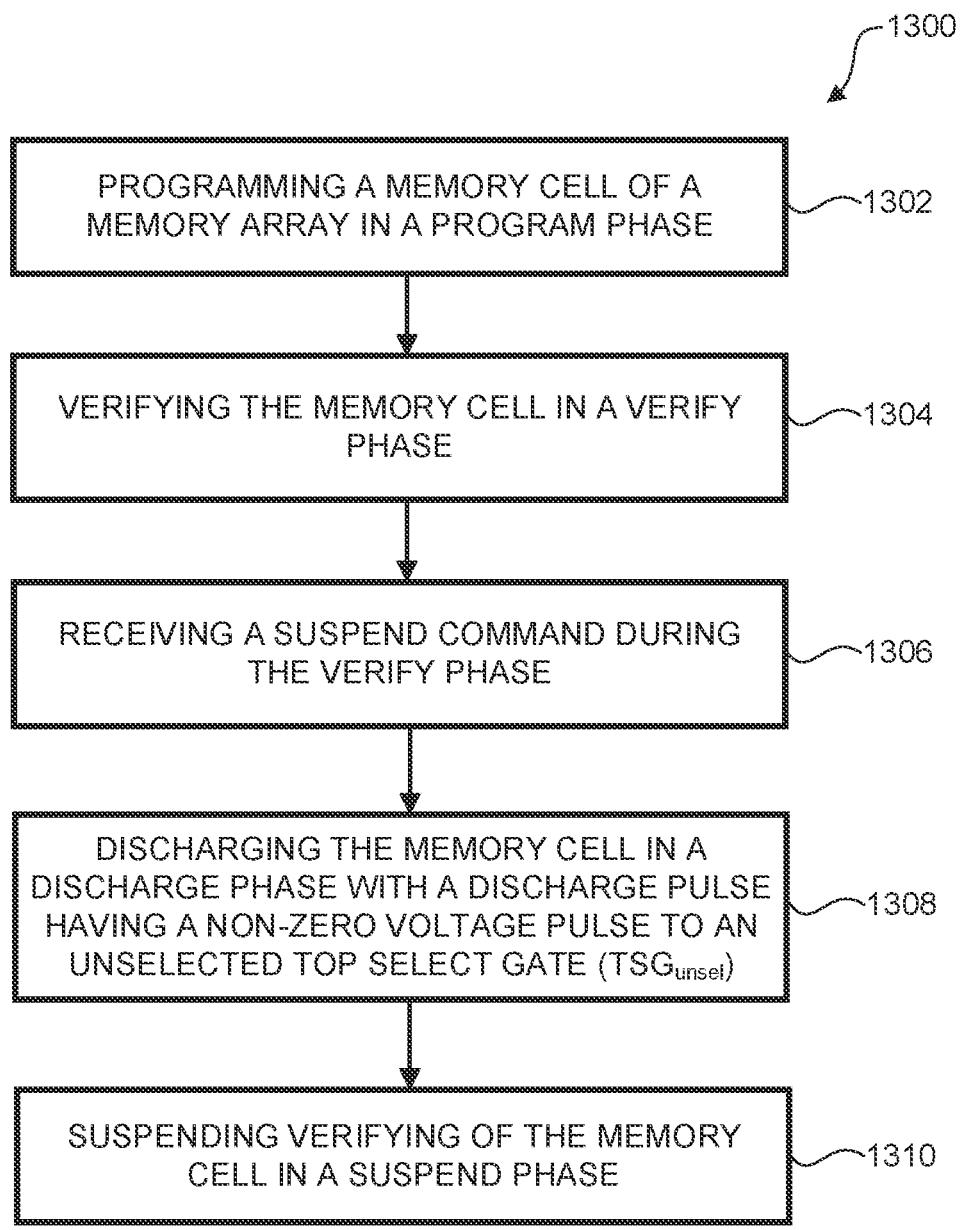
FIG. 13 illustrates a flow diagram for an operation method, according to an exemplary aspect.

FIG. 13 illustrates flow diagram 1300 for operation methods 1000, 1100 shown in FIGS. 10 and 11, according to exemplary aspects. It is to be appreciated that not all steps in FIG. 13 are needed to perform the disclosure provided herein. Further, some of the steps may be performed simultaneously, sequentially, and/or in a different order than shown in FIG. 13. Flow diagram 1300 shall be described with reference to FIGS. 1-3, 10, and 11. However, flow diagram 1300 is not limited to those example aspects.

In step 1302, as shown in the example of FIGS. 1-3, 10, and 11, memory controller 106 can program one or more memory cells 308 of memory device 108 of memory system 100 in a program phase. In some aspects, memory controller 106 can apply timing diagram 1002 to memory cell 308 of memory device 108. In some aspects, memory controller 106 can apply timing diagram 1102 to memory cell 308 of memory device 108.

In step 1304, as shown in the example of FIGS. 1-3, 10, and 11, memory controller 106 can verify one or more memory cells 308 of memory device 108 of memory system 100 in a verify phase. In some aspects, memory controller 106 can apply timing diagram 1002 to memory cell 308 of memory device 108 in verify phase 1010. In some aspects, memory controller 106 can apply timing diagram 1102 to memory cell 308 of memory device 108 in verify phase 1110.

In step 1306, as shown in the example of FIGS. 1-3, 10, and 11, memory controller 106 can send a suspend command to memory device 108 during the verify phase. In some aspects, memory device 108 (e.g., memory cell 308) can receive suspend command 1020 during verify phase 1010. In some aspects, memory device 108 (e.g., memory cell 308) can receive suspend command 1120 during verify phase 1110.

In step 1308, as shown in the example of FIGS. 1-3, 10, and 11, memory controller 106 can discharge one or more memory cells 308 of memory device 108 with a discharge pulse having a first voltage pulse to an unselected top select gate (TSG$_{unsel}$). In some aspects, memory device 108 (e.g., memory cell 308) can receive merged clean pulse 1030 with biased unselected top select gate (TSG$_{unsel}$) 1052. In some aspects, memory device 108 (e.g., memory cell 308) can receive merged clean pulse 1130 with biased unselected top select gate (TSG$_{unsel}$) 1152.

In step 1310, as shown in the example of FIGS. 1-3, 10, and 11, memory controller 106 can suspend programming of one or more memory cells 308 of memory device 108 in a suspend phase. In some aspects, memory device 108 (e.g., memory cell 308) can enter suspend phase 1035 after merged clean pulse 1030. In some aspects, memory device 108 (e.g., memory cell 308) can enter suspend phase 1135 after merged clean pulse 1130.

It is to be understood that the phraseology or terminology herein is for the purpose of description and not of limitation, such that the terminology or phraseology of the present specification is to be interpreted by those skilled in relevant art(s) in light of the teachings herein.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A method of programming a memory device, the memory device comprising a plurality of memory strings, each memory string comprising a top transistor controlled by a top select gate (TSG) and connected to a bit line (BL), a bottom transistor controlled by a bottom select gate (BSG), and a plurality of memory cells between the top transistor and the bottom transistor, each memory cell connected to a word line (WL), the method comprising:
  applying a plurality of program pulses to a memory cell of the memory device in a program phase;
  verifying a voltage value of the memory cell in a verify phase;
  receiving a suspend command and performing a suspend operation in response to the suspend command;
  applying a discharge pulse to the memory cell in a discharge phase to thereby discharge the memory cell, wherein applying the discharge pulse comprises applying:
    a first voltage pulse to an unselected top select gate ($TSG_{unsel}$), the first voltage pulse weighted to a first turn-on voltage $V_{ON1}$ of the $TSG_{unsel}$;
    a second voltage pulse to a selected top select gate ($TSG_{sel}$), the second voltage pulse weighted to a second turn-on voltage $V_{tsg}$ of the $TSG_{sel}$;
    a third voltage pulse to a bottom select gate (BSG), the third voltage pulse weighted to a third turn-on voltage $V_{ON2}$ of the BSG;
    a fourth voltage pulse to an unselected word line ($WL_{unsel}$), the fourth voltage pulse weighted to a first pass voltage $V_{PASS1}$ of the $WL_{unsel}$; and
    a fifth voltage pulse to a selected word line ($WL_{sel}$), the fifth voltage pulse weighted to a second pass voltage $V_{PASS2}$ of the $WL_{unsel}$; and
  suspending programming or verifying of the memory cell in a suspend phase.

2. The method of claim 1, wherein the suspend command is received during the program phase.

3. The method of claim 2, wherein the discharge pulse is applied between an end of a program phase loop of the program phase and a start of the suspend phase.

4. The method of claim 3, wherein applying the discharge pulse comprises applying a merged discharge pulse, wherein the merged discharge pulse overlaps the end of the program phase loop and a start of the discharge phase.

5. The method of claim 1, wherein:
  the first turn-on voltage $V_{ON1}$ can be about 0.5 V to about 5 V;
  the second turn-on voltage $V_{tsg}$ can be about 0.5 V to about 5 V;
  the third turn-on voltage $V_{ON2}$ can be about 0.5 V to about 5 V;
  the first pass voltage $V_{PASS1}$ can be about 0.5 V to about 5 V; and
  the second pass voltage $V_{PASS2}$ can be about 0.5 V to about 5 V.

6. The method of claim 1, wherein the suspend command is received during the verify phase.

7. The method of claim 6, wherein performing the suspend operation comprises immediately stopping the verify phase at a first verify state thereby decreasing a time interval of the suspend phase.

8. The method of claim 7, further comprising resuming the verify phase at a second verify state after the first verify state.

9. The method of claim 6, wherein performing the suspend operation comprises completing the entire verify phase before the discharge phase.

10. The method of claim 6, wherein applying the discharge pulse comprises applying a merged discharge pulse, wherein the merged discharge pulse overlaps an end of a verify phase loop of the verify phase and a start of the discharge phase.

11. The method of claim 10, wherein the suspend command is received at the end of the verify phase loop, at a start of a sixth voltage pulse to a programmed bit line ($BL_{pgm}$), and during the first voltage pulse of the $TSG_{unsel}$.

12. A memory device comprising:
  a memory array comprising a plurality of memory strings, each memory string comprising a top transistor controlled by a top select gate (TSG) and connected to a bit line (BL), a bottom transistor controlled by a bottom select gate (BSG), and a plurality of memory cells between the top transistor and the bottom transistor, each memory cell connected to a word line (WL); and
  a peripheral circuit coupled to the memory array, the peripheral circuit configured to:
    apply a plurality of program pulses to a memory cell of the memory array in a program phase;
    verify a voltage value of the memory cell in a verify phase;

receive a suspend command and perform a suspend operation in response to the suspend command;

apply a discharge pulse to the memory cell in a discharge phase to thereby discharge the memory cell, wherein applying the discharge pulse comprises applying:

a first voltage pulse to an unselected top select gate (TSG$_{unsel}$), the first voltage pulse weighted to a first turn-on voltage V$_{ON1}$ of the TSG$_{unsel}$;

a second voltage pulse to a selected top select gate (TSG$_{sel}$), the second voltage pulse weighted to a second turn-on voltage V$_{tsg}$ of the TSG$_{sel}$;

a third voltage pulse to a bottom select gate (BSG), the third voltage pulse weighted to a third turn-on voltage V$_{ON2}$ of the BSG;

a fourth voltage pulse to an unselected word line (WL$_{unsel}$), the fourth voltage pulse weighted to a first pass voltage V$_{PASS1}$ of the WL$_{unsel}$; and a fifth voltage pulse to a selected word line (WL$_{sel}$), the fifth voltage pulse weighted to a second pass voltage V$_{PASS2}$ of the WL$_{unsel}$; and suspend programming or verifying of the memory cell in a suspend phase.

13. The memory device of claim 12, wherein:

the peripheral circuit receives the suspend command during the program phase, and the peripheral circuit is further configured to apply a merged discharge pulse, the merged discharge pulse overlapping an end of a program phase loop of the program phase and a start of the discharge phase.

14. The memory device of claim 12, wherein the peripheral circuit receives the suspend command during the verify phase.

15. The memory device of claim 14, wherein the suspend operation comprises immediately stopping the verify phase at a first verify state after receiving the suspend command thereby decreasing a time interval of the suspend phase.

16. The memory device of claim 14, wherein the suspend operation comprises completing the entire verify phase before the discharge phase after receiving the suspend command.

17. A memory system comprising:

a memory device comprising a plurality of memory strings, each memory string comprising a top transistor controlled by a top select gate (TSG) and connected to a bit line (BL), a bottom transistor controlled by a bottom select gate (BSG), and a plurality of memory cells between the top transistor and the bottom transistor, each memory cell connected to a word line (WL); and a memory controller coupled to the memory device, the memory controller configured to:

apply a plurality of program pulses to a memory cell of the memory device in a program phase;

verify a voltage value of the memory cell in a verify phase;

receive a suspend command and perform a suspend operation in response to the suspend command;

apply a discharge pulse to the memory cell in a discharge phase to thereby discharge the memory cell, wherein applying the discharge pulse comprises applying:

a first voltage pulse to an unselected top select gate (TSG$_{unsel}$), the first voltage pulse weighted to a first turn-on voltage V$_{ON1}$ of the TSG$_{unsel}$;

a second voltage pulse to a selected top select gate (TSG$_{sel}$), the second voltage pulse weighted to a second turn-on voltage V$_{tsg}$ of the TSG$_{sel}$;

a third voltage pulse to a bottom select gate (BSG), the third voltage pulse weighted to a third turn-on voltage V$_{ON2}$ of the BSG;

a fourth voltage pulse to an unselected word line (WL$_{unsel}$), the fourth voltage pulse weighted to a first pass voltage V$_{PASS1}$ of the WL$_{unsel}$; and a fifth voltage pulse to a selected word line (WL$_{sel}$), the fifth voltage pulse weighted to a second pass voltage V$_{PASS2}$ of the WL$_{unsel}$; and suspend programming or verifying of the memory cell in a suspend phase.

18. The memory system of claim 17, wherein:

the memory controller receives the suspend command during the program phase, and the memory controller is further configured to apply a merged discharge pulse, the merged discharge pulse overlapping an end of a program phase loop of the program phase and a start of the discharge phase.

* * * * *